(12) United States Patent
Kawamura

(10) Patent No.: US 7,843,285 B2
(45) Date of Patent: Nov. 30, 2010

(54) PIEZOELECTRIC THIN-FILM FILTER

(75) Inventor: Hideki Kawamura, Ota-ku (JP)

(73) Assignee: Murata Manufacturing Co., Ltd., Kyoto (JP)

(*) Notice: Subject to any disclaimer, the term of this patent is extended or adjusted under 35 U.S.C. 154(b) by 428 days.

(21) Appl. No.: 11/854,753

(22) Filed: Sep. 13, 2007

(65) Prior Publication Data

US 2008/0007139 A1 Jan. 10, 2008

Related U.S. Application Data

(63) Continuation of application No. PCT/JP2006/307147, filed on Apr. 4, 2006.

(30) Foreign Application Priority Data

Apr. 13, 2005 (JP) ............................. 2005-116319
Apr. 20, 2005 (JP) ............................. 2005-122709

(51) Int. Cl.
H03H 9/54 (2006.01)
(52) U.S. Cl. .................... 333/187; 333/189; 333/190
(58) Field of Classification Search ................. 333/187, 333/189, 190; 310/366
See application file for complete search history.

(56) References Cited

U.S. PATENT DOCUMENTS

| | | | |
|---|---|---|---|
| 2,271,870 A * | 2/1942 | Mason | 310/361 |
| 6,342,753 B1 * | 1/2002 | Oliver et al. | 310/359 |
| 6,349,454 B1 | 2/2002 | Manfra et al. | |
| 6,734,600 B2 | 5/2004 | Aigner et al. | |
| 6,963,155 B1 * | 11/2005 | Wadaka et al. | 310/312 |
| 2002/0043888 A1 | 4/2002 | Aigner et al. | |
| 2006/0091978 A1 * | 5/2006 | Wang et al. | 333/189 |
| 2006/0284703 A1 * | 12/2006 | Iwasaki et al. | 333/133 |

FOREIGN PATENT DOCUMENTS

EP 0 952 618 A1 10/1999

(Continued)

OTHER PUBLICATIONS

Official communication issued in counterpart European Application No. 06731095.3, mailed on Jun. 9, 2008.

(Continued)

*Primary Examiner*—Robert Pascal
*Assistant Examiner*—Alan Wong
(74) *Attorney, Agent, or Firm*—Keating & Bennett, LLP

(57) ABSTRACT

A piezoelectric thin-film filter includes a first electrode pair having two or more first electrode fingers disposed on one main surface of a piezoelectric thin film and second electrode fingers disposed on the other main surface of the piezoelectric thin film so as to face the first electrode fingers. A second electrode pair includes two or more third electrode fingers disposed on the main surface such that the third electrode fingers and the first electrode fingers are disposed alternately with gaps therebetween and fourth electrode fingers disposed on the other main surface so as to face the third electrode fingers with the piezoelectric thin film therebetween. Insulating films are provided between the first and third electrode fingers. Each of the center-to-center distances Wa+Wm and Wf+Wm between the first and third electrode fingers that are disposed alternately is larger than a value twice the thickness T of the piezoelectric thin film.

24 Claims, 17 Drawing Sheets

FOREIGN PATENT DOCUMENTS

| | | |
|---|---|---|
| JP | 04-018806 A | 1/1992 |
| JP | 2001-094373 A | 4/2001 |
| JP | 2002-368576 A | 12/2002 |
| JP | 2002-541704 A | 12/2002 |
| JP | 2003-347889 A | 12/2003 |
| JP | 3535101 B2 | 6/2004 |

OTHER PUBLICATIONS

Official communication issued in the International Application No. PCT/JP2006/307147, mailed Jul. 18, 2006.

Official Communication issued in corresponding Japanese Patent Application No. 2007-521173, mailed Jan. 19, 2010.

US 7,212,084, 05/2007, Takeuchi et al. (withdrawn)

* cited by examiner

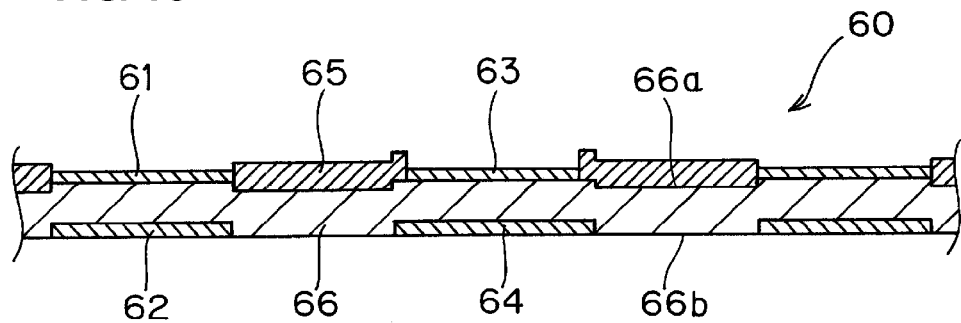
FIG. 16
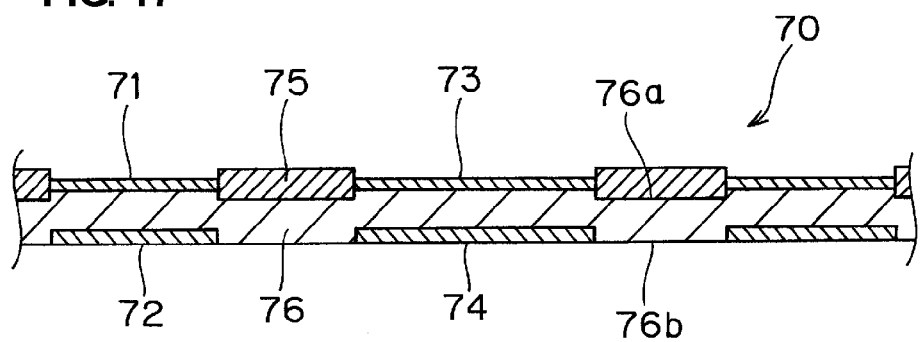
FIG. 17
FIG. 18
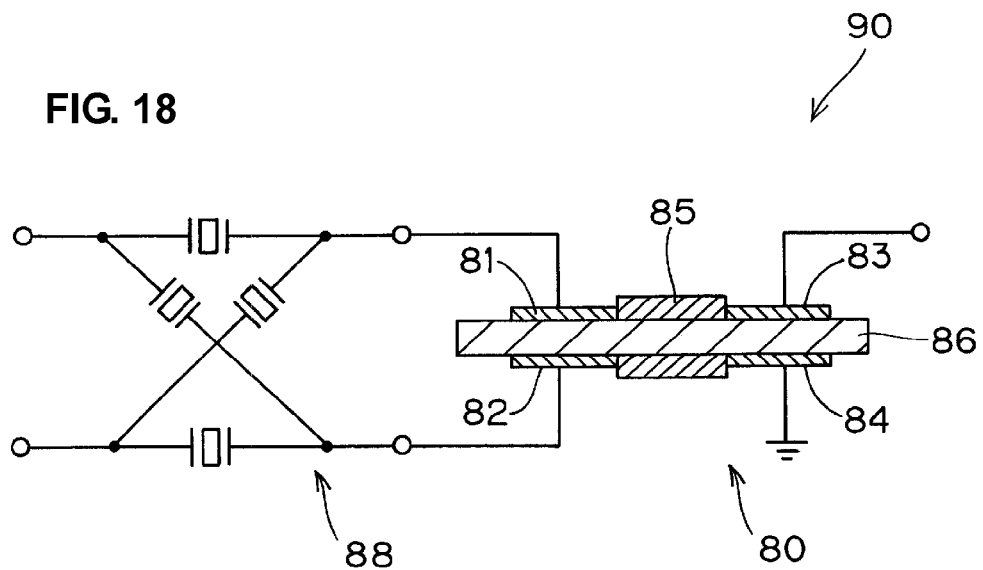

PIEZOELECTRIC THIN-FILM FILTER

BACKGROUND OF THE INVENTION

1. Field of the Invention

The present invention relates to piezoelectric thin-film filters, and more particularly, to a piezoelectric thin-film filter in which a piezoelectric thin film is sandwiched between electrodes and in which a BAW (bulk acoustic wave) resonator utilizing resonant vibration of the piezoelectric thin-film is used.

2. Description of the Related Art

In recent years, dual-mode piezoelectric thin-film filters to be used as RF filters of cellular phones have been developed. For example, Japanese Patent No. 3535101 discloses a device in which BAW resonators are disposed in a direction with a plane. As shown in FIG. 1, a supportive structure unit 2 provided on a substrate 1 supports a diaphragm 3 with a hollow space 4 therebetween, and a piezoelectric thin film 6 is disposed on the diaphragm 3. On both main surfaces of the piezoelectric thin film 6, a plurality of electrode fingers 5a and 7a of a first electrode pair and a plurality of electrode fingers 5b and 7b of a second electrode pair are disposed alternately with gaps therebetween so as to face each other across the piezoelectric thin film 6. The electrode fingers 5a and 7a of the first electrode pair are connected to input terminals, and the electrode fingers 5b and 7b of the second electrode pair are connected to output terminals. Vibration generated by a resonator formed between electrode fingers 5a and 7a of the first electrode pair is propagated to a resonator formed between adjacent electrode fingers 5b and 7b of the second electrode pair, and an electric signal is output. In this device, the impedance ratio of an input terminal to an output terminal is 1:1.

In order to achieve mechanical coupling between resonators in such a piezoelectric thin-film filter, a pitch (center-to-center distance P) between electrode fingers 5a and 7a of the first electrode pair and adjacent electrode fingers of the second electrode pair must be reduced. For example, the fourteenth paragraph of Japanese Patent No. 3535101 discloses that, in order to reduce the pitch (center-to-center distance P) between the electrode fingers 5a and 7a of the first electrode pair and the electrode fingers 5b and 7b of the second electrode pair, it is advantageous to set the width W of each of the electrode fingers 5a, 7a, 5b, and 7b to be smaller than a value twice the thickness T of the piezoelectric thin film 6, that is, to set the value such that W<2T is satisfied.

However, when the width of each of the electrode fingers 5a, 5b, 7a, and 7b is reduced, the bandwidth of the piezoelectric thin-film filter is reduced.

SUMMARY OF THE INVENTION

In order to overcome the problems described above, preferred embodiments of the present invention provide a piezoelectric thin-film filter that has an increased bandwidth.

In addition, a BAW filter may adopt a dual mode with a configuration used for a monolithic crystal filter (MCF). In dual-mode BAW filters, a plurality of BAW resonators are disposed in a direction with a plane.

For example, an RF filter of a cellular phone is connected between an antenna (with an impedance of about 50 Ω) and an LNA (with an input impedance within a range from about 100 Ω to about 200 Ω). Thus, for a piezoelectric thin-film filter used as an RF filter, it is required to adjust the impedance ratio of an input terminal to an output terminal to within a range from 1:2 to 1:4.

However, the piezoelectric thin-film filter using a known BAW resonator cannot meet such a requirement.

In order to overcome such problems, other preferred embodiments of the present invention provide a piezoelectric thin-film filter that uses a BAW resonator and that is capable of adjusting the impedance ratio of an input terminal to an output terminal.

According to a preferred embodiment of the present invention, a piezoelectric thin-film filter includes a substrate, a piezoelectric thin film supported by the substrate and including a portion that is acoustically separated from the substrate, a first electrode pair including two or more first electrode fingers disposed on one main surface of the portion of the piezoelectric thin film that is acoustically separated from the substrate and two or more second electrode fingers disposed on the other main surface of the portion of the piezoelectric thin film that is acoustically separated from the substrate so as to face the first electrode fingers with the piezoelectric thin film therebetween, and a second electrode pair including two or more third electrode fingers disposed on the one main surface of the portion of the piezoelectric thin film that is acoustically separated from the substrate such that the first electrode fingers and the third electrode fingers are disposed alternately with gaps therebetween and fourth electrode fingers disposed on the other main surface of the portion of the piezoelectric thin film that is acoustically separated from the substrate so as to face the third electrode fingers with the piezoelectric thin film therebetween. A filter element defined by the first electrode pair and the second electrode pair is provided between a set including a first terminal connected to each of the first electrode fingers and a second terminal connected to each of the second electrode fingers and a set including a third terminal connected to each of the third electrode fingers and a fourth terminal connected to each of the fourth electrode fingers. Insulating films are provided between the first electrode fingers and the third electrode fingers that are disposed alternately with the gaps therebetween on the one main surface of the piezoelectric thin film. Each of the center-to-center distances between the first electrode fingers and the third electrode fingers that are disposed alternately with the gaps therebetween is larger than a value twice the thickness of the portion of the piezoelectric thin film that is acoustically separated from the substrate.

With this configuration, for example, when the first terminal and the second terminal are input terminals and the third terminal and the fourth terminal are output terminals, the piezoelectric thin-film filter is capable of functioning as a double-mode filter.

With this configuration, since the insulating films are provided between adjacent first electrode fingers and third electrode fingers, mechanical coupling between resonators formed between the first electrode fingers and the third electrode fingers that face each other with the piezoelectric thin film therebetween and resonators formed between the third electrode fingers and the fourth electrode fingers that face each other with the piezoelectric thin film therebetween can be strengthened. Thus, propagation of vibration between adjacent resonators can be easily performed. Accordingly, even if each of the center-to-center distances between the first electrode fingers and the third electrode fingers is larger than the value twice the thickness of the piezoelectric thin film, a function as a filter can be attained.

With this configuration, when each of the center-to-center distances between the first electrode fingers and the third electrode fingers is set to be larger than the value twice the thickness of the piezoelectric thin film, the width of each of the electrode fingers can be increased. Thus, a value Δf as a thickness-longitudinal-vibration-type resonator can be increased. Moreover, by using three or more resonance peaks, the bandwidth of the filter can be increased.

When the electrode width is simply increased, vibration energy is easily trapped in each of the resonators defined by electrode fingers that face each other with the piezoelectric thin film therebetween. Thus, a substantially constant filter characteristic cannot be achieved in a pass band. When the insulating films are provided between the first electrode fingers and the third electrode fingers, trapping of vibration energy in each of the resonators is suppressed. Thus, propagation of vibration between the resonators is easily performed, and an excellent filter characteristic can be achieved.

Furthermore, since each of the center-to-center distances between the first electrode fingers and the third electrode fingers is set to be larger than the value twice the thickness of the piezoelectric thin film, the capacitance between input and output can be reduced. Thus, the out-of-band attenuation can be reduced.

On the other main surface of the piezoelectric thin film, insulating films may be provided between adjacent second electrode fingers and fourth electrode fingers.

According to another preferred embodiment of the present invention, a piezoelectric thin-film filter includes a substrate; a piezoelectric thin film supported by the substrate and including a portion that is acoustically separated from the substrate; two or more first electrode fingers disposed on one main surface of the portion of the piezoelectric thin film that is acoustically separated from the substrate and two or more third electrode fingers disposed on the one main surface of the portion of the piezoelectric thin film that is acoustically separated from the substrate such that the first electrode fingers and the third electrode fingers are disposed alternately with gaps therebetween; and a common electrode disposed on the other main surface of the portion of the piezoelectric thin film that is acoustically separated from the substrate and including portions facing the first electrode fingers and the third electrode fingers with the piezoelectric thin film therebetween. A first electrode pair is defined by the first electrode fingers and the common electrode. A second electrode pair is defined by the third electrode fingers and the common electrode. A filter element defined by the first electrode pair and the second electrode pair is provided between a set including a first terminal connected to each of the first electrode fingers and a second terminal connected to the common electrode and a set including a third terminal connected to each of the third electrode fingers and a fourth terminal connected to the common electrode. Insulating films are provided between the first electrode fingers and the third electrode fingers that are disposed alternately with the gaps therebetween on the one main surface of the piezoelectric thin film. Each of the center-to-center distances between the first electrode fingers and the third electrode fingers that are disposed alternately with the gaps therebetween is larger than a value twice the thickness of the piezoelectric thin film.

With this configuration, for example, when the first terminal and the second terminal are input terminals and the third terminal and the fourth terminal are output terminals, the piezoelectric thin-film filter is capable of functioning as a dual-mode filter.

With this configuration, since the insulating films are provided between adjacent first electrode fingers and third electrode fingers, coupling between resonators formed between the first electrode fingers and the common electrode that face each other with the piezoelectric thin film therebetween and resonators formed between the third electrode fingers and the common electrode that face each other with the piezoelectric thin film therebetween can be strengthened. Thus, propagation of vibration between adjacent resonators can be easily performed. Accordingly, even if each of the center-to-center distances between the first electrode fingers and the third electrode fingers is larger than the value twice the thickness of the piezoelectric thin film, a function as a filter can be attained.

With this configuration, when each of the center-to-center distances between the first electrode fingers and the third electrode fingers is set to be larger than the value twice the thickness of the piezoelectric thin film, the width of each of the electrode fingers can be increased. Thus, a value $\Delta f$ as a thickness-longitudinal-vibration-type resonator can be increased. Moreover, by using three or more resonance peaks, the bandwidth of the filter can be increased.

When the electrode width is simply increased, vibration energy is easily trapped in each of the resonators formed by electrode fingers that face each other with the piezoelectric thin film therebetween. Thus, a substantially constant filter characteristic cannot be achieved in a pass band. When the insulating films are provided between the first electrode fingers and the third electrode fingers, trapping of vibration energy in each of the resonators is suppressed. Thus, propagation of vibration between the resonators is easily performed, and an excellent filter characteristic can be achieved.

Furthermore, since each of the center-to-center distances between the first electrode fingers and the third electrode fingers is set to be larger than the value twice the thickness of the piezoelectric thin film, the capacitance between input and output can be reduced. Thus, the out-of-band attenuation can be reduced.

With this configuration, even if the alignment of the common electrode disposed on the other main surface of the piezoelectric thin film with respect to the first electrode fingers and the third electrode fingers disposed on the one main surface of the piezoelectric thin film deviates, such deviation hardly affects the characteristics of the resonators. Thus, unlike a case in which electrode fingers face each other with a piezoelectric thin film therebetween, high-accuracy alignment is not necessary. Therefore, a simplified process can be achieved.

Each of the piezoelectric thin-film filters configured as described above may have various configurations as specifically described below.

Preferably, the width of each of the electrode fingers is larger than the value twice the thickness of the portion of the piezoelectric thin film that is acoustically separated from the substrate.

With this configuration, the width of each of the electrode fingers can be increased. Thus, the bandwidth can be increased.

Preferably, at least two filter elements are provided. Preferably, the first terminal and the second terminal of each of the filter elements are connected in parallel to one of input terminals and output terminals. Preferably, the third terminal and the fourth terminal of each of the filter elements are connected in series between the other one of the input terminals and the output terminals.

With this configuration, by setting the impedance between input terminals to be different from the impedance between output terminals, the ratio of impedance between the input terminals to the impedance between the output terminals can be adjusted.

Preferably, the first terminal and the second terminal are connected to unbalanced terminals. Preferably, the third terminal and the fourth terminal are connected to balanced terminals.

With this configuration, a so-called balanced filter having a balanced-to-unbalanced conversion function can be achieved.

Preferably, the piezoelectric thin film is acoustically separated from the substrate with a gap layer or an opening therebetween.

With this configuration, the piezoelectric thin film is capable of trapping longitudinal waves and transverse waves at the same time in a portion in which thickness vibration is excited. Thus, an excellent filter characteristic can be achieved. When the piezoelectric thin film is acoustically separated from the substrate with a sound-reflecting layer, only vibration of waves having a sonic speed corresponding to the thickness of the sound-reflecting layer is trapped. Thus, a characteristic of a double-mode filter using both longitudinal waves and transverse waves is disturbed.

Preferably, the one main surface of the piezoelectric thin film includes, outside a resonant area in which the first electrode fingers, the third electrode fingers, and the insulating films are disposed, a non-resonant area that continuously extends from the resonant area.

With this configuration, vibration is not propagated from the resonant area to the non-resonant area. Thus, vibration is trapped within the resonant area, and waves are not propagated outside. Therefore, a filter characteristic having no spurious can be achieved.

Preferably, the piezoelectric thin-film filter further includes a second insulating film provided in at least one of a first area covering the first electrode fingers, the third electrode fingers, and the insulating films; a second area covering the second electrode fingers and the fourth electrode fingers; and a third area covering the common electrode.

With this configuration, by appropriately processing the second insulating film, a frequency characteristic can be adjusted. In addition, the second insulating film prevents the electrode fingers or the common electrode from being oxidized. The second insulating film may be made of a material that is the same as or different from a material of the insulating films provided between the first electrode fingers and the third electrode fingers.

Preferably, the first electrode fingers, the third electrode fingers, and the insulating films are formed using a common resist pattern on the one main surface of the piezoelectric thin film.

With this configuration, by using the common resist pattern, deviation of the alignment among the insulating films, the first electrode fingers, and the third electrode fingers is avoided. This, a simplified manufacturing process can be achieved.

Preferably, the piezoelectric thin film is an epitaxial film.

With this configuration, stable mechanical coupling can be achieved between adjacent resonators. That is, since a dual-mode filter uses waves propagating in the direction with a plane of a piezoelectric thin film, the dual-mode filter is prone to be affected by crystal grain boundary. However, an epitaxial film is not prone to be affected by grain boundary. Thus, stable mechanical coupling between adjacent resonators can be achieved.

Preferably, the total sum of the number of pairs of first electrode fingers and second electrode fingers or common electrode included in the first electrode pair and the number of pairs of third electrode fingers and fourth electrode fingers or common electrode included in the second electrode pair is twenty or more.

When the total number of pairs is twenty or more, ripples each having a short period can be reduced. Thus, a filter characteristic having less spurious can be achieved.

Preferably, the number of pairs of first electrode fingers and second electrode fingers or common electrode included in the first electrode pair is different from the number of pairs of third electrode fingers and fourth electrode fingers or common electrode included in the second electrode pair.

With this configuration, the impedance ratio of an input terminal to an output terminal can be set to any value.

In addition, another preferred embodiment of the present invention provides a composite filter configured as described below.

In the composite filter, a ladder filter or a lattice filter and any one of the above-mentioned piezoelectric thin-film filters are cascaded together.

With this configuration, a composite filter exhibiting an excellent out-of-band attenuation characteristic can be achieved.

In the piezoelectric thin film, the filter element is a unit. At least two units connected in series to one of input terminals and output terminals are provided. At least two of the at least two units are connected in parallel to the other one of the output terminals and the input terminals.

With this configuration, BAW resonators are formed by the electrode pairs. With this configuration, by setting the impedance between input terminals to be different from the impedance between output terminals, the ratio of the impedance between the input terminals to the impedance between the output terminals can be adjusted.

Preferably, the at least two units are disposed adjacent to each other, and the adjacent units are mechanically coupled together.

With this configuration, a plurality of units operate integrally. Thus, ripples each having a short period can be reduced.

Preferably, the input terminals are connected to unbalanced terminals, and the output terminals are connected to balanced terminals.

With this configuration, a so-called balanced filter having a balanced-to-unbalanced conversion function can be achieved.

Preferably, the piezoelectric thin film is acoustically separated from the substrate with a gap or an opening therebetween.

When the piezoelectric thin film is acoustically separated from the substrate with a sound-reflecting layer, only vibration of waves having a sonic speed corresponding to the thickness of the sound-reflecting layer is trapped. Thus, a characteristic of a double-mode filter using both longitudinal waves and transverse waves is disturbed. In contrast, with the above-mentioned configuration, the piezoelectric thin film is capable of trapping longitudinal waves and transverse waves at the same time in a portion in which thickness vibration is excited. Thus, an excellent filter characteristic can be achieved.

More specifically, the piezoelectric thin-film filter may be configured in accordance with various preferred embodiments, as described below.

In the piezoelectric thin-film filter according to a first preferred embodiment, first and second units are provided. The first terminal of each of the units is connected to one of the input terminals. The second terminal of each of the units is connected to the other one of the input terminals. The fourth terminal of the first unit is connected to the third terminal of the second unit. The third terminal of the first unit is connected to one of the output terminals. The fourth terminal of the second unit is connected to the other one of the output terminals. The output terminals are connected to balanced terminals.

With this configuration, a balanced piezoelectric thin-film filter in which the impedance ratio of an input terminal to an output terminal is not 1:1 (for example, the impedance ratio of the input terminal to the output terminal is 1:4) can be achieved.

In the piezoelectric thin-film filter according to a second preferred embodiment, first and second units are provided. The first terminal of the first unit and the second terminal of the second unit are connected to one of the input terminals. The second terminal of the first unit and the first terminal of the second unit are connected to the other one of the input terminals. The fourth terminals of the units are connected to each other. The third terminal of the first unit and the third terminal of the second unit are connected to the output terminals. The output terminals are connected to balanced terminals.

With this configuration, a balanced piezoelectric thin-film filter in which the impedance ratio of an input terminal to an output terminal is not 1:1 (for example, the impedance ratio of the input terminal to the output terminal is 1:4) can be achieved. With this configuration, the balance is much improved compared with the above-mentioned first preferred embodiment.

In the piezoelectric thin-film filter according to a third preferred embodiment, first to fourth units are provided. The first terminal of the first unit and the first terminal of the second unit are connected to one of the input terminals. The second terminal of the first unit, the second terminal of the second unit, the first terminal of the third unit, and the first terminal of the fourth unit are connected to each other. The second terminal of the third unit and the second terminal of the fourth unit are connected to the other one of the input terminals. The third terminal of the first unit is connected to one of the output terminals. The fourth terminal of the first unit is connected to the third terminal of the second unit. The fourth terminal of the second unit is connected to the third terminal of the third unit. The fourth terminal of the third unit is connected to the third terminal of the fourth unit. The fourth terminal of the fourth unit is connected to the other one of the output terminals. The output terminals are connected to balanced terminals.

With this configuration, a balanced piezoelectric thin-film filter in which the impedance ratio of an input terminal to an output terminal is not 1:1 (for example, the impedance ratio of the input terminal to the output terminal is 1:4) can be achieved. With this configuration, by setting the length of each of the electrode fingers to be twice the length of each of the electrode fingers used in the above-mentioned first preferred embodiment and setting the number of electrode fingers to be twice the number of electrode fingers used in the above-mentioned first preferred embodiment, the influence of parasitic capacitance of wires can be reduced.

Preferably, at least one common electrode is disposed on the portion of the one main surface (or the other main surface) of the piezoelectric thin film that is acoustically separated from the substrate. Preferably, the first electrode fingers and the third electrode fingers (or the second electrode fingers and the fourth electrode fingers) of at least one unit is part of the same common electrode.

With this configuration, even if the alignment between the first electrode fingers and the third electrode fingers (or the second electrode fingers and the fourth electrode fingers) disposed on the one main surface (or the other main surface) of the piezoelectric thin film and the second electrode fingers and the fourth electrode fingers (or the first electrode fingers and the third electrode fingers) disposed on the other main surface (or the one main surface) of the piezoelectric thin film is deviated, such deviation hardly affects the characteristics of resonators. Thus, unlike a case in which electrode fingers face each other with a piezoelectric thin film therebetween, high-accuracy alignment is not necessary. Therefore, a simplified process can be achieved.

Preferably, insulating films are provided between adjacent electrode fingers in the portion of at least one of the main surfaces of the piezoelectric thin film that is acoustically separated from the substrate.

With this configuration, since the insulating films are provided between adjacent electrode fingers, mechanical coupling between resonators formed between electrode fingers that face each other with the piezoelectric thin film therebetween and resonators formed between adjacent electrode fingers that face each other with the piezoelectric thin film therebetween can be strengthened. Thus, propagation of vibration between adjacent resonators can be easily performed. Therefore, a filter characteristic can be improved.

A piezoelectric thin-film filter according to preferred embodiments of the present invention achieves an increased bandwidth. The piezoelectric thin-film filter according to preferred embodiments of the present invention is of a type using a BAW resonator and is capable of adjusting the impedance ratio of an input terminal to an output terminal.

Other features, elements, characteristics and advantages of the present invention will become more apparent from the following detailed description of preferred embodiments thereof with reference to the attached drawings.

BRIEF DESCRIPTION OF THE DRAWINGS

FIG. 13B is a main-portion sectional view of the piezoelectric thin-film filter according to a preferred embodiment of the present invention.

FIG. 16 is a main-portion sectional view of a piezoelectric thin-film filter according to a preferred embodiment of the present invention.

FIG. 17 is a main-portion sectional view of a piezoelectric thin-film filter according to a preferred embodiment of the present invention.

FIG. 18 shows a configuration of a composite filter according to a preferred embodiment of the present invention.

DETAILED DESCRIPTION OF THE PREFERRED EMBODIMENTS

Preferred embodiments of the present invention will be described with reference to FIGS. 2 to 23.

First Preferred Embodiment

A piezoelectric thin-film filter 10 according to a first preferred embodiment will be described with reference to FIGS. 2 to 15.

Figure 1:
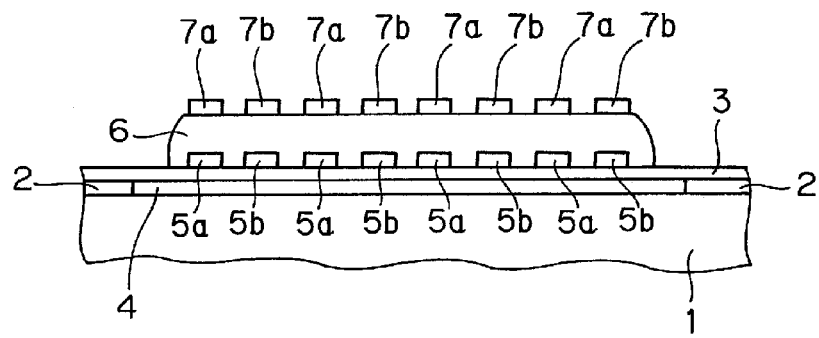
FIG. 1 shows a configuration of a conventional piezoelectric thin-film filter.
Figure 2:
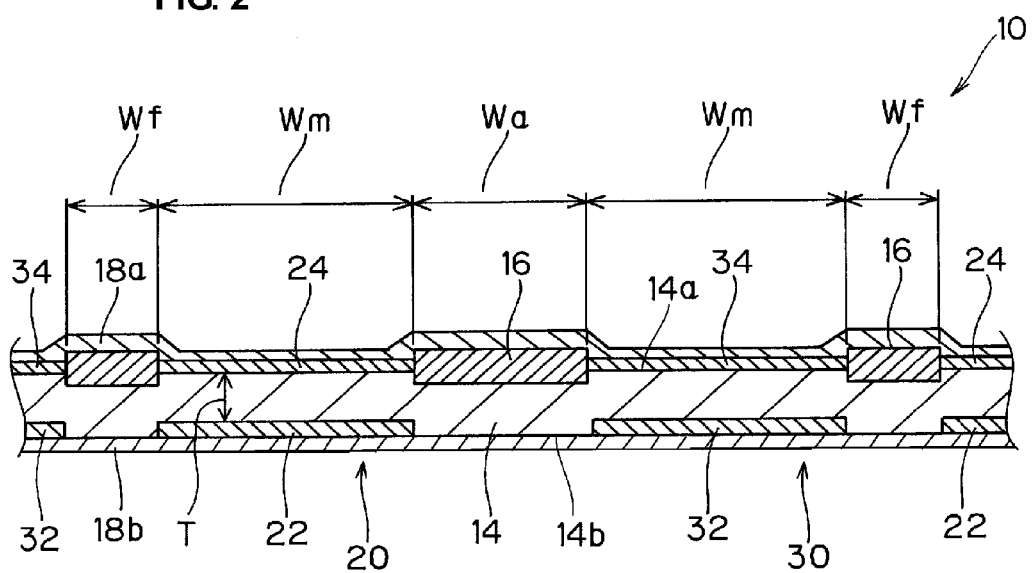
FIG. 2 is a main-portion sectional view showing a basic configuration of a piezoelectric thin-film filter according to a preferred embodiment of the present invention.

FIG. 2 is a main-portion sectional view showing a basic configuration of the piezoelectric thin-film filter 10 according to the first preferred embodiment. A portion including a basic period unit is illustrated in FIG. 2. Actually, however, a plurality of portions are repeated.

On main surfaces 14a and 14b of a piezoelectric thin film 14, first electrode fingers 24 and second electrode fingers 22 of a first electrode pair 20 and third electrode fingers 34 and fourth electrode fingers 32 of a second electrode pair 30 are disposed alternately with gaps therebetween.

On the main surface (upper surface) 14a of the piezoelectric thin film 14, an insulating film 16 for adding mass is provided between adjacent first and third electrode fingers 24 and 34.

Over the entire main surfaces 14a and 14b of the piezoelectric thin film 14, second insulating films 18a and 18b are provided. That is, on the main surface 14a side, the second insulating film 18a covers the first electrode fingers 24, the third electrode fingers 34, and the insulating films 16. On the main surface 14b side, the second insulating film 18b covers the second electrode fingers 22 and the fourth electrode fingers 32. Only one of the second insulating films 18a and 18b may be formed. Alternatively, none of the second insulating films 18a and 18b may be formed. The second insulating films 18a and 18b may be made of a material that is the same as or different from a material of the insulating films 16, which are provided between the first electrode fingers 24 and the third electrode fingers 34.

When the second insulating films 18a and 18b are subjected to etching after an element is completed, the frequency of the element can be adjusted. The second insulating films 18a and 18b have an advantage in preventing the electrode fingers 22, 24, 32, and 34 from being oxidized or eroded.

Each of the center-to-center distances Wa+Wm and Wf+Wm between the electrode fingers 24 and 34, which are alternately disposed with the insulating films 16 therebetween, is larger than a value twice the thickness T of the piezoelectric thin film 14. Preferably, the width Wm of each of the electrode fingers 22, 24, 32, and 34 is larger than the value twice the thickness T of the piezoelectric thin film 14.

Figure 5:
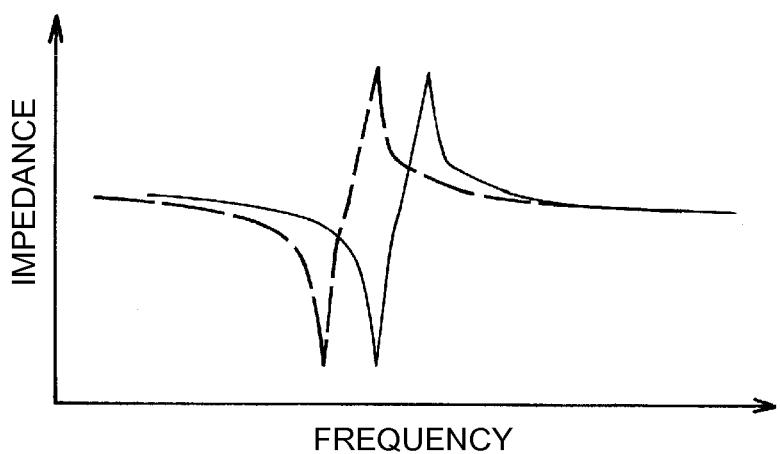
FIG. 5 is a graph showing a characteristic of a resonator.
Figure 6:
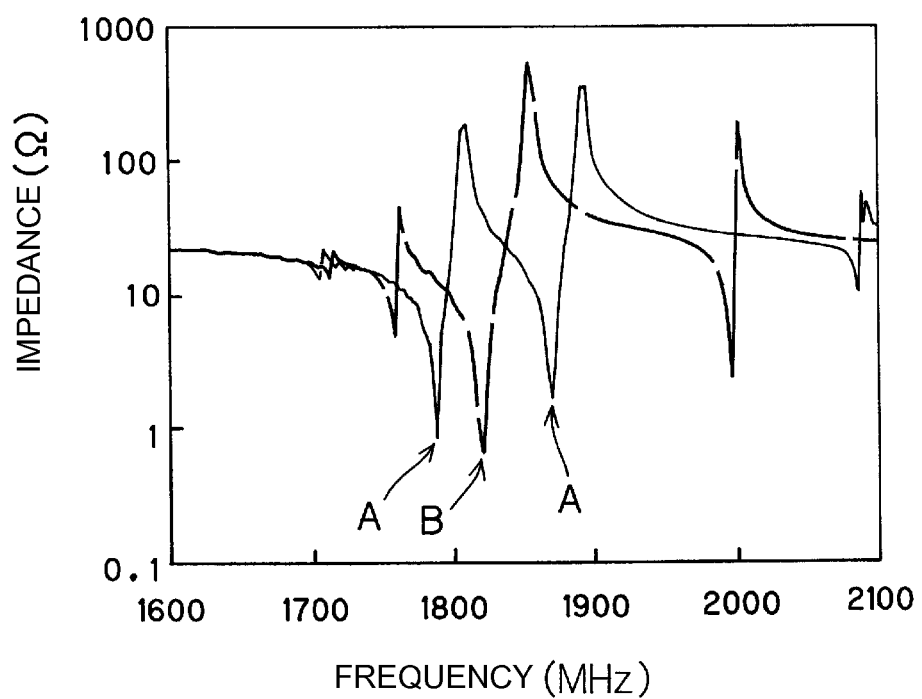
FIG. 6 is a graph showing a characteristic of a resonator.

Thus, as shown in FIG. 6 described later, a plurality of vibration modes can be generated. When the width of an electrode finger is narrow, only one resonance peak appears near a desired frequency, as schematically shown in FIG. 5 later.

Distances between the electrode fingers 24 and 34 that are adjacent to each other, that is, the widths Wa and Wf of non-electrode portions may be the same as or different from each other.

The first and second electrode fingers 24 and 22 are connected to input terminals and the third and fourth electrode fingers 34 and 32 are connected to output terminals. Accordingly, a dual-mode filter is formed. In this case, the dual-mode filter can be used as a balanced input/output filter. When the electrode finger 24, 22, 34, or 32 is grounded as an unbalanced terminal, the dual-mode filter can be used as a balanced filter.

A known dual-mode BAW filter will now be described. The basic principle of the dual-mode BAW filter is the same as a monolithic crystal filter (MCF) or a dual-mode SAW filter.

Figure 3:
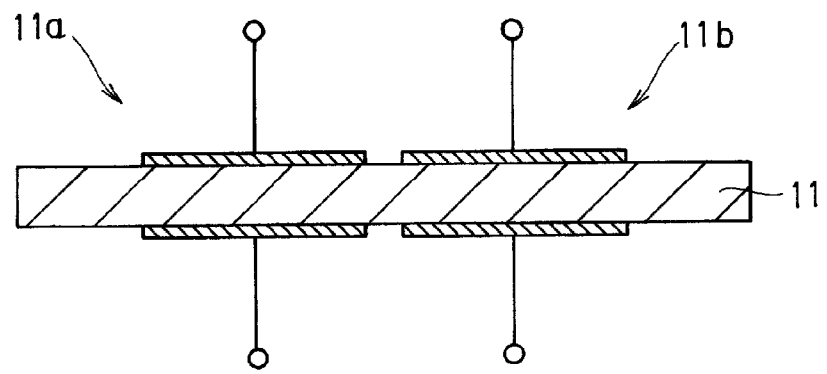
FIG. 3 shows a configuration of a dual-mode filter.

As shown in FIG. 3, when two resonators 11a and 11b are formed on the same piezoelectric electrode film 11, if the resonators 11a and 11b are arranged to be sufficiently spaced away from each other, each of the resonators 11a and 11b operates as an independent resonator. If the two resonators 11a and 11b are disposed close to each other, the adjacent resonators 11a and 11b are coupled to each other, and vibrations in a symmetric mode and an asymmetric mode are generated.

Figure 4A:
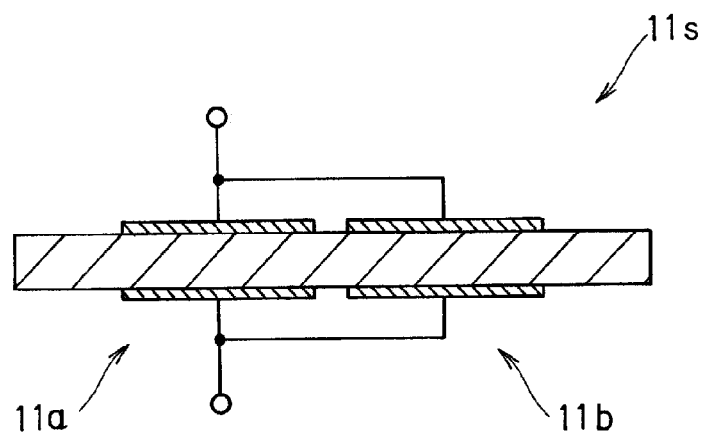
FIGS. 4A-4B show configurations of a dual-mode filter.
Figure 4B:
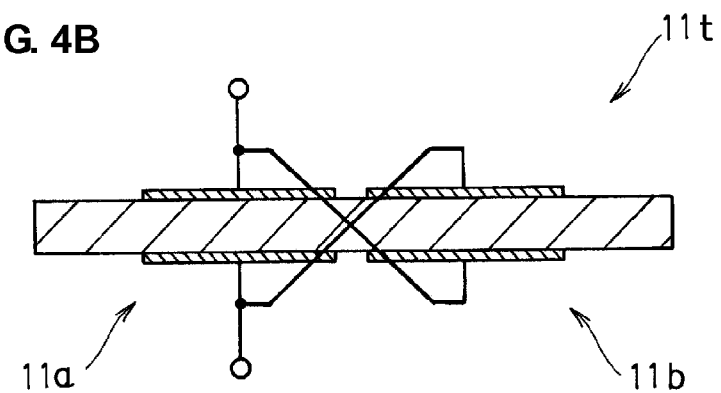

FIG. 4A shows a unit 11s, which is a filter element using a symmetric mode generated as a result of coupling between the two resonators 11a and 11b. FIG. 4B shows a unit 11t, which is a filter element using an asymmetric mode generated as a result of coupling between the two resonators 11a and 11b.

FIG. 5 schematically shows the characteristics of the units 11s and 11t, which are filter elements. The solid line represents the characteristics of the unit 11s, which is a filter element in the symmetric mode. The broken line represents the characteristics of the unit 11t, which is a filter element in the asymmetric mode. By appropriately coupling the two resonators 11a and 11b, excitation in the two modes with different frequencies can be achieved. With the use of the frequency difference, a dual-mode filter can be provided.

The piezoelectric thin-film filter 10 achieves a wide-band filter characteristic when the width Wm of each of the electrode fingers 22, 24, 32, and 34 is set to an appropriate value. For example, when the width Wm of each of the electrode fingers 22, 24, 32, and 34 is larger than a value twice the thickness T of the piezoelectric thin film 14, a spurious vibration is generated in the vicinity. By using the spurious vibration effectively, a wide-band filter with a plurality of modes can be achieved.

For a resonator utilizing thickness vibration, when an electrode size in a direction with a plane is increased, spurious vibration approaches main vibration. Thus, formerly, the electrode size is set to be sufficiently small. However, with such a decreased electrode size, a resonator having only a small $\Delta f$ (the difference between an anti-resonant frequency and a resonant frequency) is achieved.

In the piezoelectric thin-film filter disclosed in Japanese Patent No. 3535101, since the width of an electrode finger is small, $\Delta f$ of a resonator formed by an electrode pair is small. Thus, even if coupling between electrode pairs is achieved, a filter having only a narrow bandwidth is formed. In contrast, if the width of an electrode finger is too large, vibration energy is trapped in each electrode pair. Thus, coupling between electrode pairs is reduced.

In FIG. 6, concerning the piezoelectric thin-film filter 10, the solid line represents a characteristic in the symmetric mode (a vibration mode of resonators in which the first and third electrode fingers 24 and 34 are connected in common and the second and fourth electrode fingers 22 and 32 are connected in common), and the broken line represents a characteristic in the asymmetric mode (a vibration mode of resonators in which the first and fourth electrode fingers 24 and 32 are connected in common and the second and third electrode fingers 22 and 34 are connected in common). At about 1790 MHz to 1900 MHz, two resonance peaks in the symmetric mode, which are represented by symbol A, and a resonance peak in the asymmetric mode, which is represented by symbol B, appear.

Figure 7:
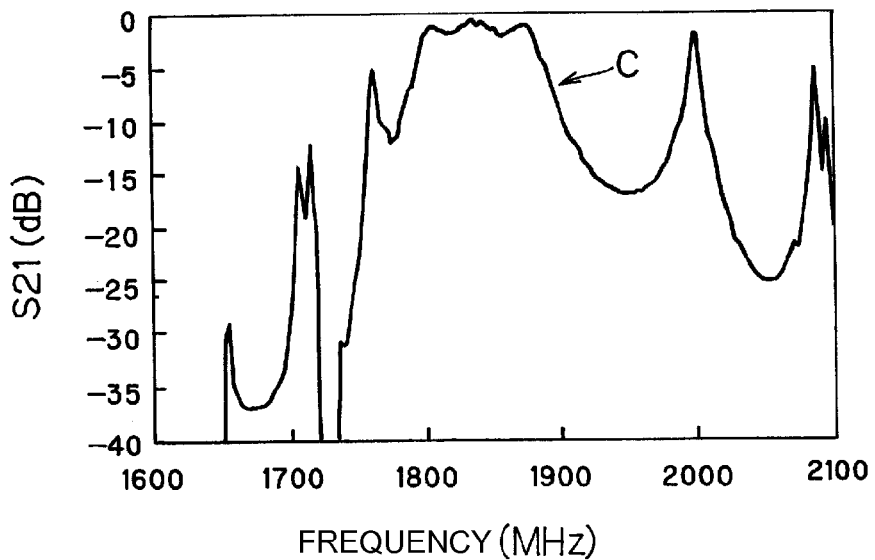
FIG. 7 is a graph showing a filter characteristic.

With the use of such a plurality of resonances, a filter having a characteristic represented by sign C in FIG. 7 can be achieved. In FIG. 7, a bandwidth with attenuation from about 0 dB to about 3 dB is about 80 MHz (a fractional bandwidth of about 4.4%), which is wider than a bandwidth of about 60 MHz when resonance in a single symmetric mode is used.

In addition, in the piezoelectric thin-film filter 10, the insulating films 16 for adding mass are provided in non-electrode portions between the first and third electrode fingers 24 and 34, thus achieving an improvement in the filter characteristic.

Since a known ceramic vibrator used in a bandwidth on the order of MHz exhibits a frequency reduction of about 1% due to an electrode, no insulating film is necessary.

In contrast, a thin-film BAW resonator used in a bandwidth on the order of GHz exhibits a frequency reduction of about 10% or more. Thus, it is difficult to apply the known theory relating to energy trapping to the thin-film BAW resonator.

Figure 8:
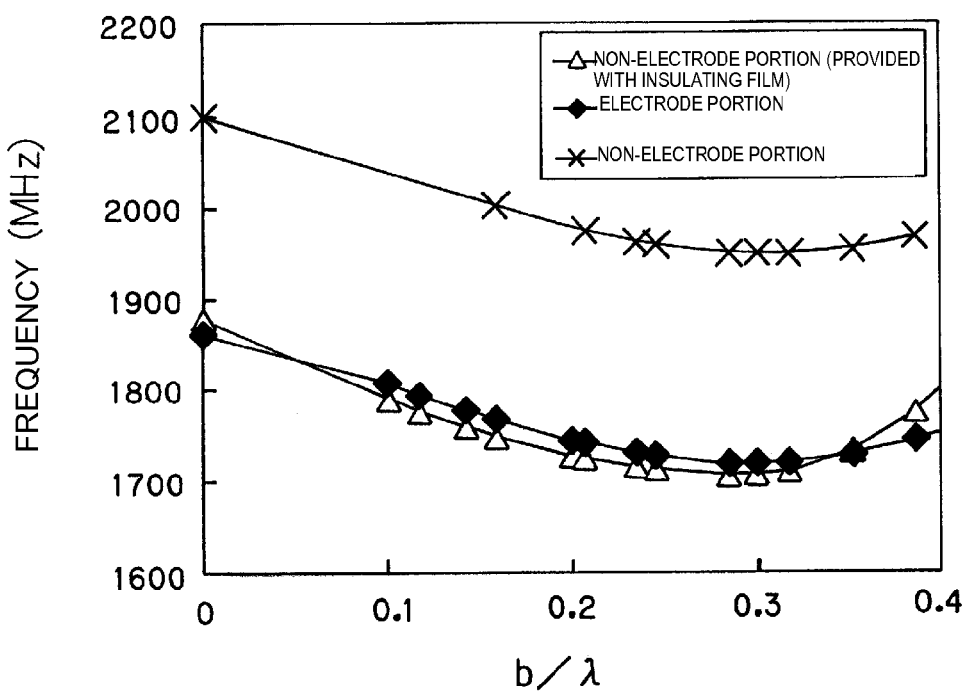
FIG. 8 is a graph showing dispersion curves.

For example, FIG. 8 shows dispersion curves (hybrid waves in a thickness-longitudinal-vibration-type basic mode and a thickness-shear-vibration-type double mode) in a configuration of a thin-film BAW resonator. The horizontal axis represents $b/\lambda$, which is obtained by normalizing a piezoelectric thin-film thickness b using the wavelength $\lambda$ of a wave propagating in the direction with the plane, and the vertical axis represents frequency (MHz). In addition, triangular symbols represent cases where an insulating film is provided in a non-electrode portion, diamond symbols represent cases where no insulating film is provided in an electrode portion, and cross symbols represent cases where no insulating film is provided in a non-electrode portion.

In a case where the slope when the number of waves is zero slants down to the right, frequency-reduction-type energy trapping cannot be achieved according to the energy trapping theory. However, in a thin-film BAW resonator in which no insulating film is provided in a non-electrode portion, there is a big difference between an electrode portion and a non-electrode portion. Thus, a vibration mode generating leakage from the electrode portion to the non-electrode portion is not provided, and substantially all the vibration energy can be trapped in the electrode portion.

With such an effect unique to a thin-film BAW resonator, energy is easily trapped in an electrode portion. Thus, coupling between electrode pairs is weakened. The insulating films 16 for adding mass are provided in non-electrode portions. Thus, as shown in FIG. 8, frequencies of the electrode portions and the non-electrode portions can be closed to each other. Consequently, waves propagate in a non-electrode portion between two adjacent electrode pairs. Thus, by strengthening the coupling between adjacent electrode pairs, excitation in two modes with different frequencies (the symmetric mode and the asymmetric mode) can be achieved.

The configuration of the piezoelectric thin-film filter 10 will be described next.

Figure 11:
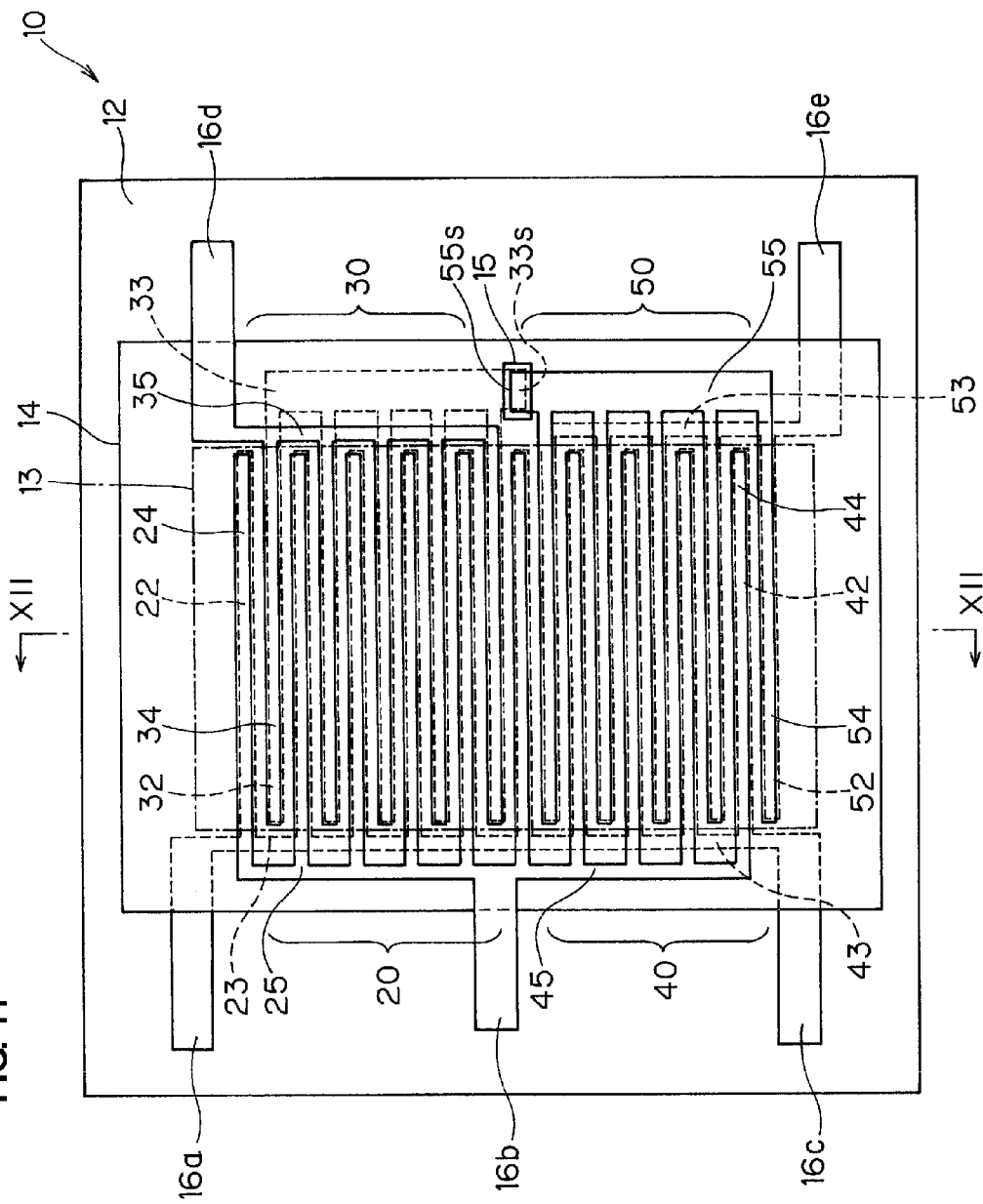
FIG. 11 is a plan view of a piezoelectric thin-film filter according to a preferred embodiment of the present invention.
Figure 12A:
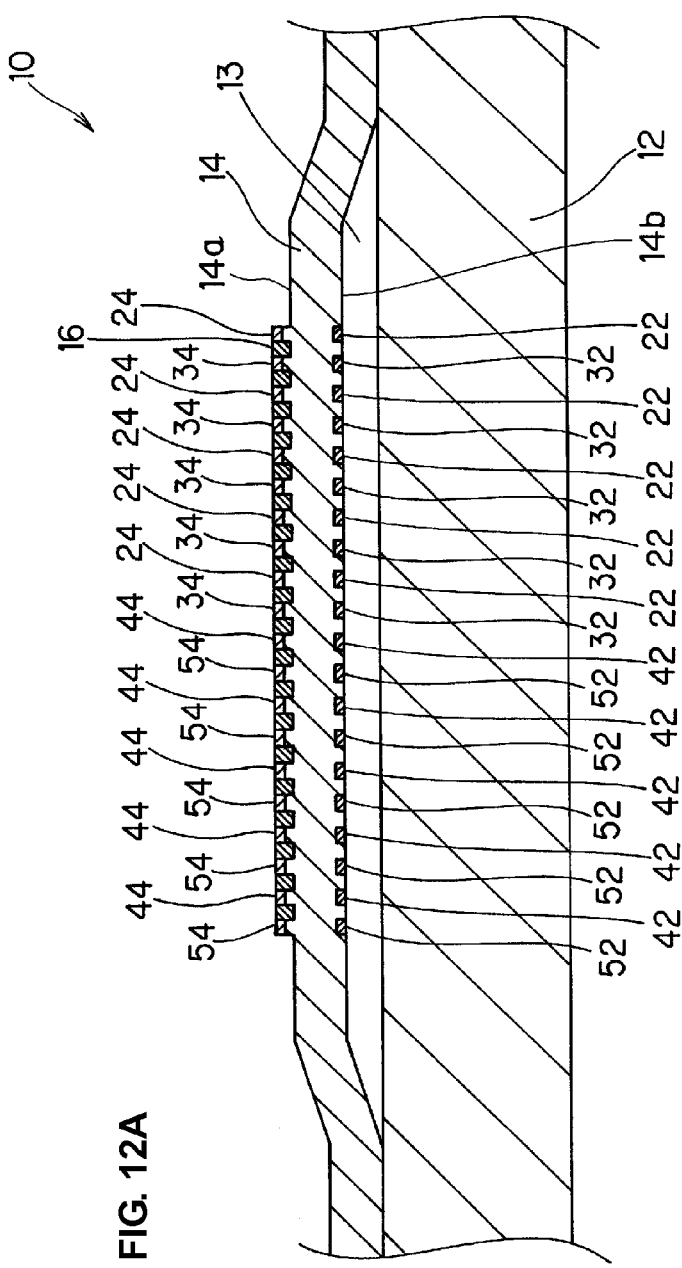
FIG. 12A is a main-portion sectional view taken along the line XII-XII of FIG. 11.

As shown in the plan view of FIG. 11 and the main-portion sectional view of FIG. 12A, on a portion of the piezoelectric thin film 14 that is separated from a substrate 12 with a gap 13 therebetween, the portion being part of the piezoelectric thin film 14 supported by the substrate 12, a first unit 91 (see FIG. 14), which is a first filter element including the first electrode pair 20 and the second electrode pair 30, and a second unit 92 (see FIG. 14), which is a second filter element including a third electrode pair 40 and a fourth electrode pair 50, are disposed.

For easier understanding, the illustration of FIG. 11 is shown in a deviated manner intentionally. The first electrode pair 20 and the third electrode pair 40 are arranged such that five first electrode fingers 24 and five first electrode fingers 44 disposed on one main surface (the upper surface 14a in FIG. 12) of the piezoelectric thin film 14 and five second electrode fingers 22 and five second electrode fingers 42 disposed on the other main surface (the lower surface 14b in FIG. 12) of the piezoelectric thin film 14 face each other with the piezoelectric thin film 14 therebetween. Similarly, the second electrode pair 30 and the fourth electrode pair 50 are arranged such that five third electrode fingers 34 and five third electrode fingers 54 disposed on the upper surface 14a (see FIG. 12) of the piezoelectric thin film 14 and five fourth electrode fingers 32 and five fourth electrode fingers 52 disposed on the lower surface 14b (see FIG. 12) of the piezoelectric thin film 14 face each other with the piezoelectric thin film 14 therebetween. On the upper surface 14a of the piezoelectric thin film 14, the first electrode fingers 24 and 44 of the first electrode pair 20 and the third electrode pair 40 and the third electrode fingers 34 and 54 of the second electrode pair 30 and the fourth electrode pair 50 are disposed alternately with gaps therebetween. On the lower surface 14b of the piezoelectric thin film 14, the second electrode fingers 22 and 42 of the first electrode pair 20 and the third electrode pair 40 and the fourth electrode fingers 32 and 52 of the second electrode pair 30 and the fourth electrode pair 50 are disposed alternately with gaps therebetween.

The two units 91 and 92 are disposed adjacent to each other in the portion of the piezoelectric thin film 14 that is separated from the substrate 12 with the gap 13 therebetween. The gap between electrode fingers 32 and 34 of the first unit 91 and adjacent electrode fingers 42 and 44 of the second unit 92 is substantially the same as the gap between adjacent electrode fingers 22 and 32, 24 and 34, 52 and 42, and 53 and 44 of the units 91 and 92. Thus, since the adjacent units 91 and 92 are mechanically coupled together, the entire units 91 and 92 operate integrally, resulting in reducing ripples each having a short period.

A piezoelectric film may be disposed above a recessed portion of the substrate so that a gap can be formed. A piezoelectric film may be formed at an opening of the substrate so that acoustical separation can be achieved.

Figure 12B:
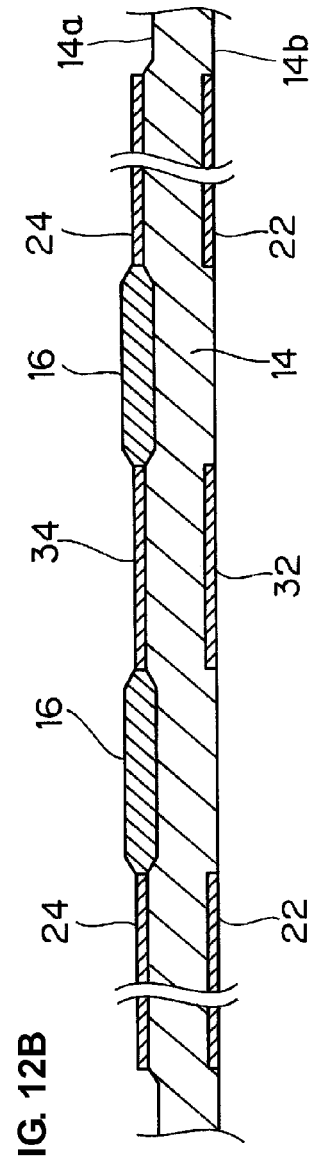
FIG. 12B is a main-portion enlarged sectional view taken along the line XII-XII of FIG. 11 according to a preferred embodiment of the present invention.
Figure 13:
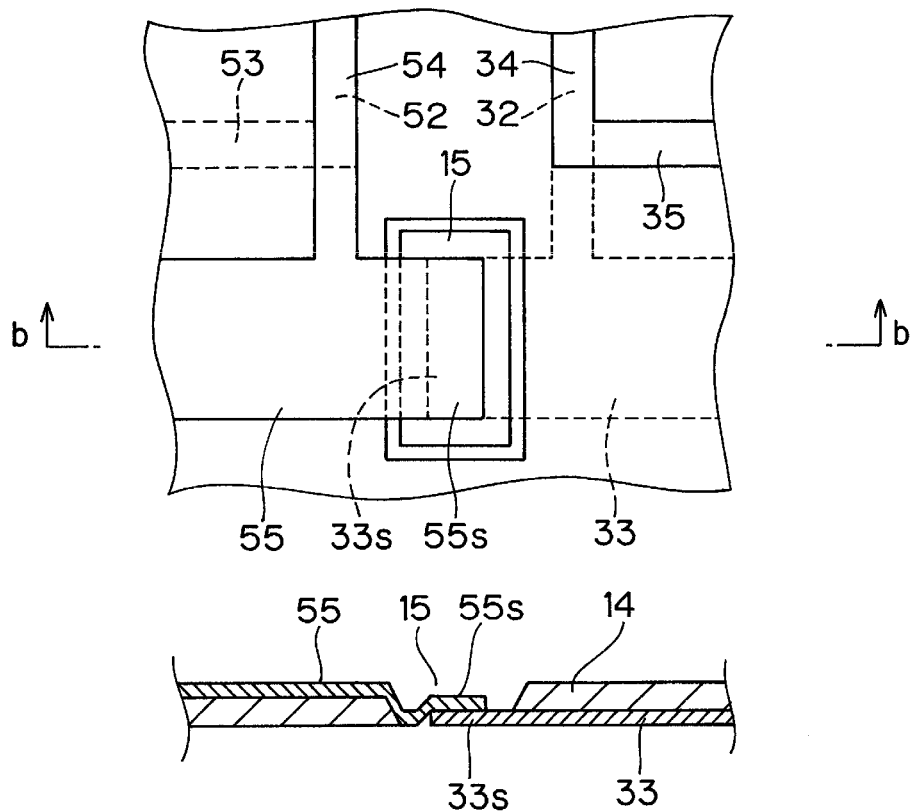
FIG. 13 is a main-portion enlarged plan view of a piezoelectric thin-film filter.

As shown in FIGS. 12A and 12B, on the upper surface 14a of the piezoelectric thin film 14, the insulating films 16 are disposed in gaps between adjacent electrode fingers 24, 34, 44, and 54.

As shown in FIG. 12A, the insulating films 16 are disposed only in an area (hereinafter, referred to as a "resonant area") at the inner side of the outermost electrode fingers 24 and 54 in the arrangement of the electrode fingers 24, 34, 44, and 54. The filter can be arranged such that an insulating film is also provided on a portion of the upper surface 14a of the piezoelectric thin film 14 that continuously extends from the resonant area. However, when no insulating film is provided outside the resonant area, the frequency of the area outside the resonant area is higher than the frequency of the resonant area. Thus, vibration energy can be trapped in the resonant area, and energy leakage from the resonant area can be prevented. Therefore, a low-loss filter producing no spurious can be achieved.

As shown in FIG. 11, wires (busbars) 25 and 45 connecting the first electrode fingers 24 of the first electrode pair 20 and the first electrode fingers 44 of the third electrode pair 40, respectively, are connected to a port-1 terminal 16b. Wires (busbars) 23 and 43 connecting the second electrode fingers 22 of the first electrode pair 20 and the second electrode fingers 42 of the third electrode pair 40 are connected to GND terminals 16a and 16c, respectively, and the wires (busbars) 23 and 43 are connected to each other.

A wire (busbar) 35 connecting the third electrode fingers 34 of the second electrode pair 30 is connected to a port-2 terminal 16d. A wire (busbar) 53 connecting the fourth electrode fingers 52 of the fourth electrode pair 50 is connected to a port-3 terminal 16e.

As shown in the main-portion enlarged plan view of FIG. 13A and the main-portion enlarged sectional view of FIG. 13B, a wire (busbar) 33 connecting the fourth electrode fingers 32 of the second electrode pair 30 and a wire (busbar) 55 connecting the third electrode fingers 54 of the fourth electrode pair 50 are formed such that end portions 33s and 55s of the wires (busbars) 33 and 55 overlap each other and are connected to each other in a breakthrough (hereinafter, referred to as a through-hole) 15 formed in the piezoelectric thin film 14. FIG. 13B is a sectional view taken along the line b-b of FIG. 13A.

The wires 33 and 55 are located at electrically neutral points between the terminals 16d and 16e. The wires 33 and 55 may be electrically floated or grounded.

Figure 14:
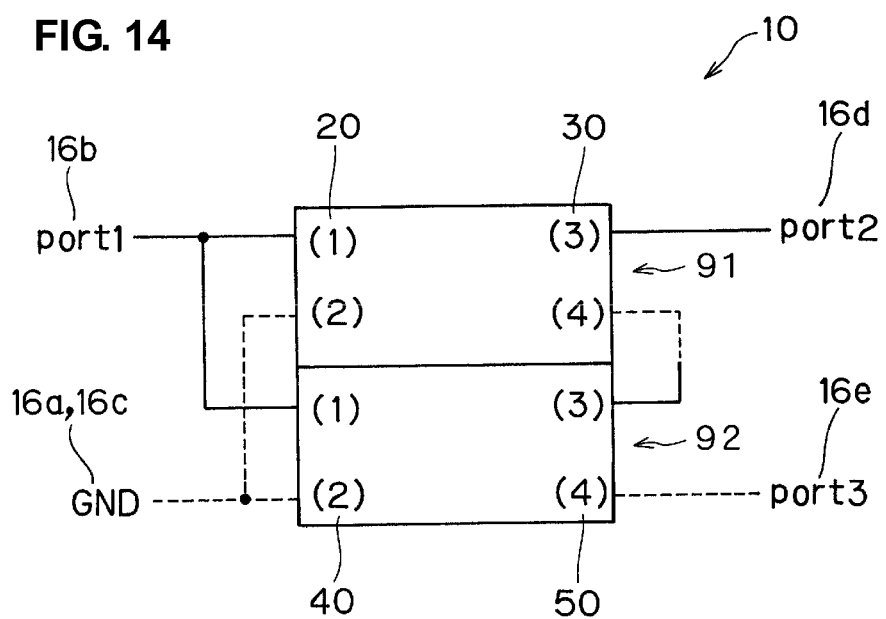
FIG. 14 is a block diagram of a piezoelectric thin-film filter according to a preferred embodiment of the present invention.

As shown in FIG. 14, in the piezoelectric thin-film filter 10, the input terminals 16b; and 16a and 16c are connected in parallel to the first electrode pair 20 and the third electrode pair 40, and the output terminals 16d and 16e are connected in series to the second electrode pair 30 and the fourth electrode pair 50. For example, the input terminals 16b; and 16a and 16c are connected to unbalanced terminals, and unbalanced signals are input to the input terminals 16b; and 16a and 16c. The output terminals 16d and 16e are connected to balanced terminals, and balanced signals are output. Input and output may be reversed. In FIG. 14, (1) represents the first electrode fingers 24 and 44, (2) represents the second electrode fingers 22 and 42, (3) represents the third electrode fingers 34 and 54, and (4) represents the fourth electrode fingers 32 and 52. The solid lines represent wires on the upper surface 14a side of the piezoelectric thin film 14, and the broken lines represent wires on the lower surface 14b side of the piezoelectric thin film 14. The input/output impedance of each of the units 91 and 92 corresponds to the impedance of each of the electrode pairs 20, 30, 40, and 50.

When the impedance of each of the electrode pairs 20, 30, 40, and 50 is about 100 Ω, the impedance on the input side, which is connected in parallel, is about 50 Ω, and the impedance on the output side, which is connected in series, is about 200 Ω. Thus, the impedance ratio of an input terminal to an output terminal is 1:4. In this case, for 50 Ω-200 Ω termination, low insertion loss and a wide bandwidth can be achieved.

For example, an RF filter of a cellular phone is connected between an antenna (with an impedance of about 50 Ω) and an LNA (with an input impedance within a range from about 100 Ω to about 200 Ω). Thus, for a piezoelectric thin-film filter used as an RF filter, it is required to adjust the impedance ratio of an input terminal to an output terminal to within a range from 1:2 to 1:4. The piezoelectric thin-film filter 10 meets such a requirement.

A method for forming the insulating films 16 will be described next with reference to FIG. 16.

A sacrificial layer (not shown) used for forming the gap 13 and the second insulating film 18b are formed in that order on the substrate 12, and a conducting film is formed on the sacrificial layer. A resist is applied on the conducting film, an unnecessary portion of the conducting film is eliminated by etching using a resist pattern that is formed by exposure and development, and lower electrode patterns, such as the electrode fingers 22 and 32, are formed. Then, the resist pattern is eliminated.

Figure 15A:
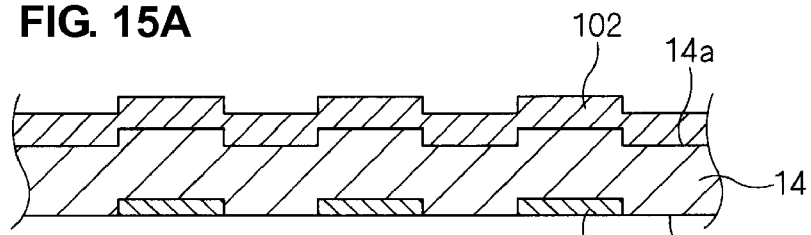
FIGS. 15A-15E include illustrations for explaining a process to form an insulating film according to a preferred embodiment of the present invention.

Then, as shown in FIG. 15A, on the lower electrode patterns 100 formed by the conducting film and the exposed second insulating film 18b (see FIG. 2), the piezoelectric thin film 14 and an insulating film 102 are formed in that order.

Figure 15B:
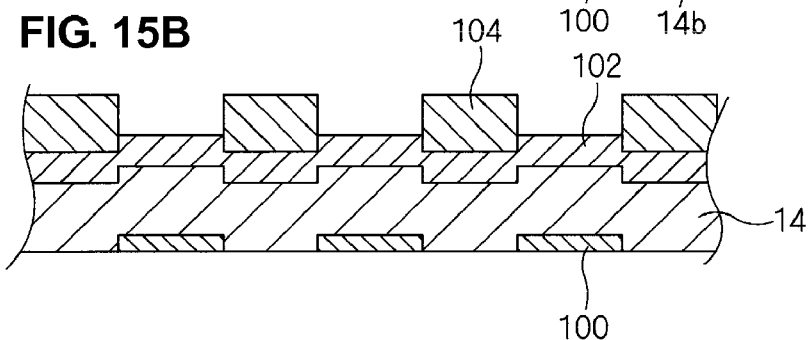

Then, as shown in FIG. 15B, a resist is applied on the insulating film 102, and a common resist pattern 104 is formed by exposure and development.

Figure 15C:
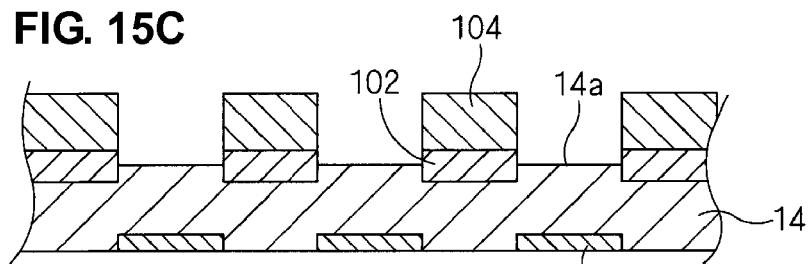

Then, as shown in FIG. 15C, an unnecessary portion of the insulating film 102 is eliminated by etching or the like using the common resist pattern 104, and the upper surface 14a of the piezoelectric thin film 14 is exposed.

Figure 15D:
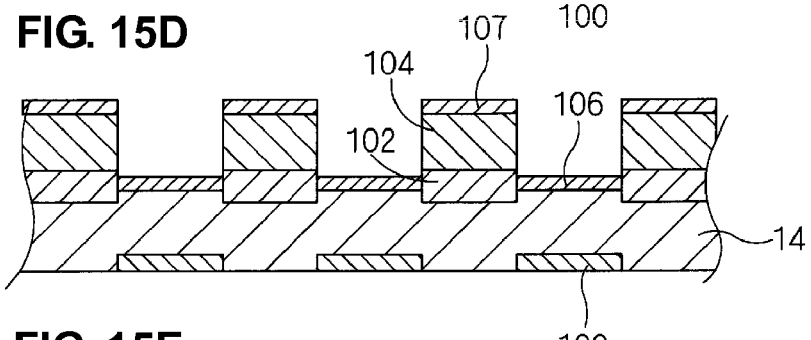

Then, as shown in FIG. 15D, in a state in which the common resist pattern 104 is maintained, conducting films 106 and 107 are formed on the exposed upper surface 14a of the piezoelectric thin film 14 and the common resist pattern 104, respectively.

Figure 15E:
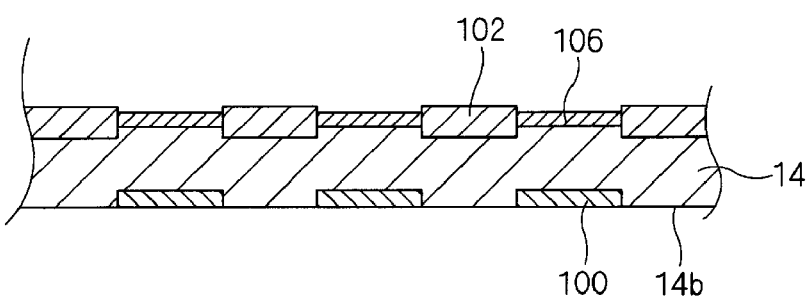

Then, as shown in FIG. 15E, the common resist pattern 104 and the conducting film 107 formed on the common resist pattern 104 are eliminated. Upper electrode patterns, such as the electrode fingers 24 and 34, are formed using the remaining conducting film 106.

With the use of the common resist pattern, a simplified manufacturing process can be achieved. Moreover, deviation in the alignment of the insulating films 16 with respect to the electrode fingers 24 and 34 can be prevented.

Then, after the second insulating film 18b (see FIG. 2) is formed on the insulating film 102 and the conducting film 106, the sacrificial layer is eliminated and the gap 13 is formed.

A specific example of the configuration of the piezoelectric thin-film filter 10 will be described next.

The piezoelectric thin film 14 is preferably made of AlN with a thickness of about 2.7 μm, electrode patterns, such as the electrode fingers 22 and 24; 32 and 34; 42 and 44; and 52 and 54 and the wires (busbars) 23 and 25; 33 and 35; 43 and 45; and 53 and 55 of the electrode pairs 20, 30, 40, and 50, are preferably made of Al with a thickness of about 0.7 μm, and the insulating films 16 are preferably made of SiO2 with a thickness of about 0.34 μm. It is preferable that an AlN film is a uniaxially oriented film. It is more preferable that the AlN film is an epitaxial AlN film. Since a dual-mode filter uses waves propagating in the direction with a plane of a piezoelectric thin film, the dual-mode filter is prone to be affected by crystal grain boundary. However, an epitaxial film is not prone to be affected by grain boundary. Thus, stable mechanical coupling between adjacent resonators and an excellent filter characteristic can be achieved.

The width of each of the electrode fingers 22 and 24; 32 and 34; 42 and 44; and 52 and 54 is about 12 μm, and each of the gaps between adjacent first electrode fingers 24 and 44 and third electrode fingers 34 and 54 (that is, the width of each of the insulating films 16 provided between the electrode fingers 22 and 24; 32 and 34; 42 and 44; and 52 and 54) is about 11 μm. The length of each of the electrode fingers 22 and 24; 32 and 34; 42 and 44; and 52 and 54 is determined so as to meet a desired impedance (the impedance of each of the electrode pairs 20, 30, 40, and 50 is about 100 Ω). The impedance of each of the electrode pairs 20, 30, 40, and 50 is inversely proportional to the product L×N of the length L of each of the electrode fingers 22 and 24; 32 and 34; 42 and 44; and 52 and 54 and the number N of pairs.

Figure 9A:
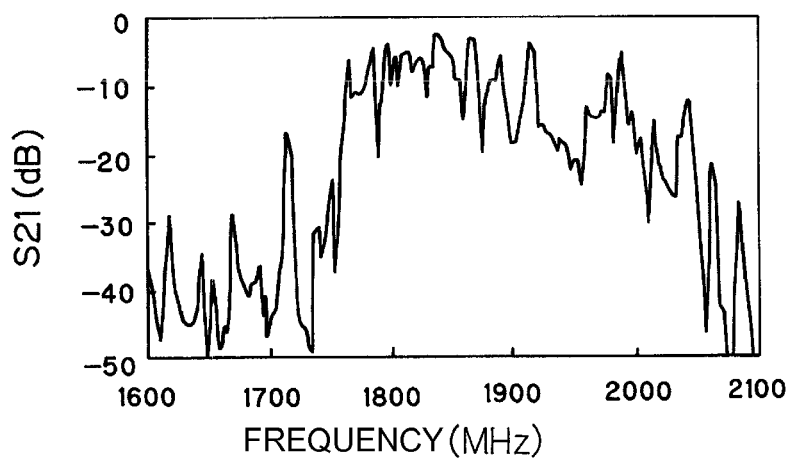
FIGS. 9A-9C include graphs showing filter characteristics.
Figure 9B:
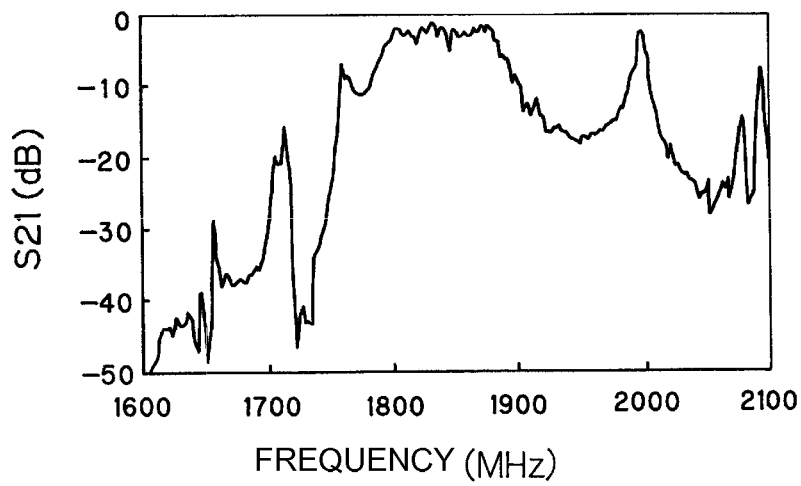
Figure 9C:
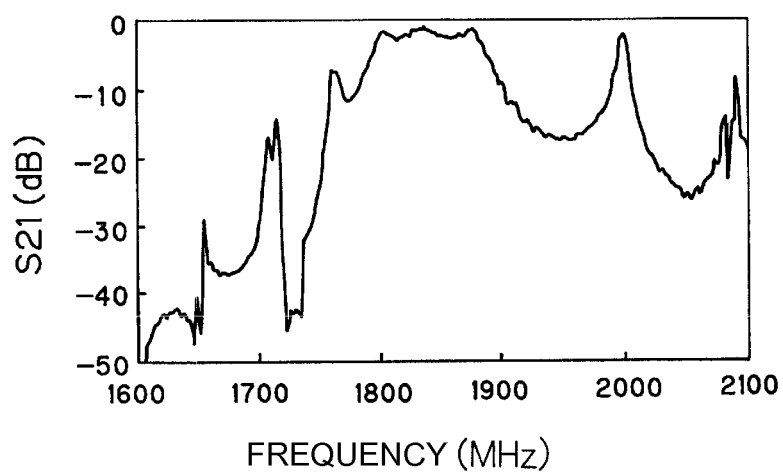

FIGS. 9A-C include graphs each showing the relationship between the number of electrode pairs and a filter characteristic. FIG. 9A shows a case where the sum of the number of pairs of electrode fingers in the first electrode pair on the input side and the number of pairs of electrode fingers in the second electrode pair on the output side (hereinafter, referred to as the "total number of pairs") is two, FIG. 9B shows a case where the total number of pairs is 12, and FIG. 9C shows a case where the total number of pairs is 20. The horizontal axis represents frequency (MHz) and the vertical axis represents a transfer factor S21 (dB). As is clear from FIGS. 9A to 9C, when the total number of pairs is 20 or more, ripples each having a short period can be reduced. Thus, an excellent filter characteristic with less spurious can be achieved.

Figure 10A:
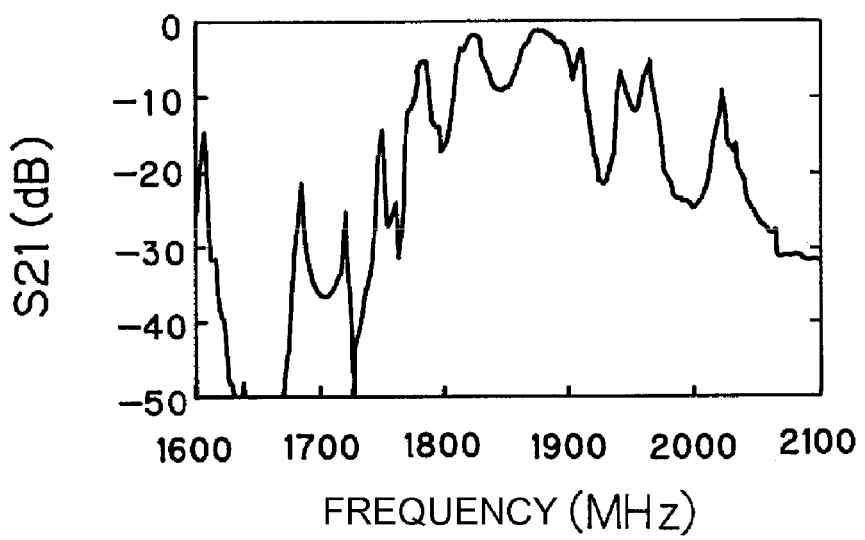
FIG. 10A is a graph showing a filter characteristic.
Figure 10B:
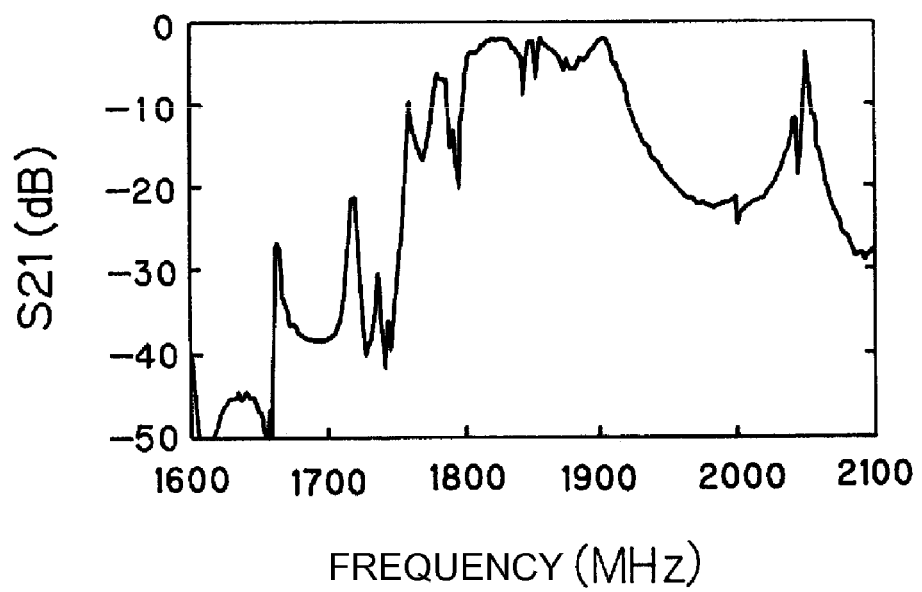
FIG. 10B is a graph showing a filter characteristic.
Figure 10C:
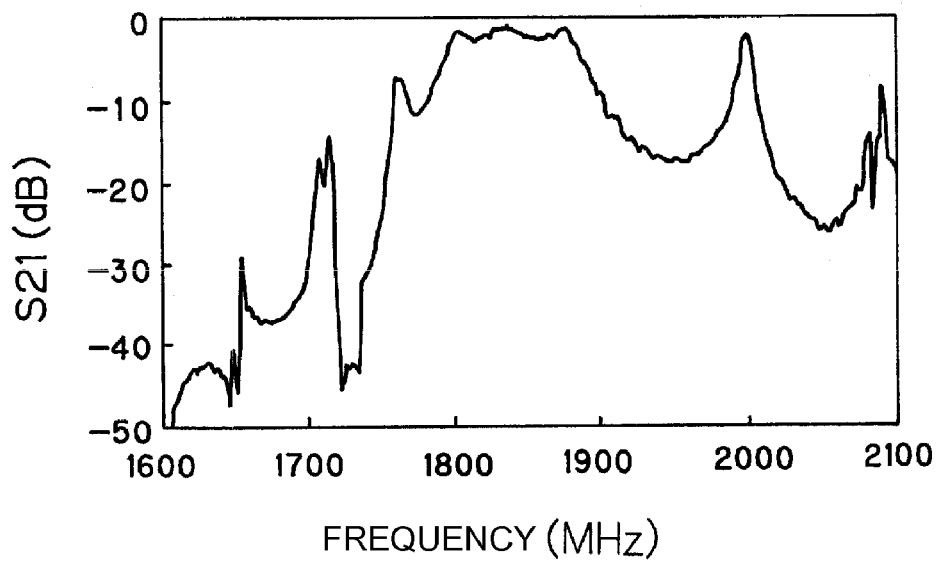
FIG. 10C is a graph showing a filter characteristic.
Figure 10D:
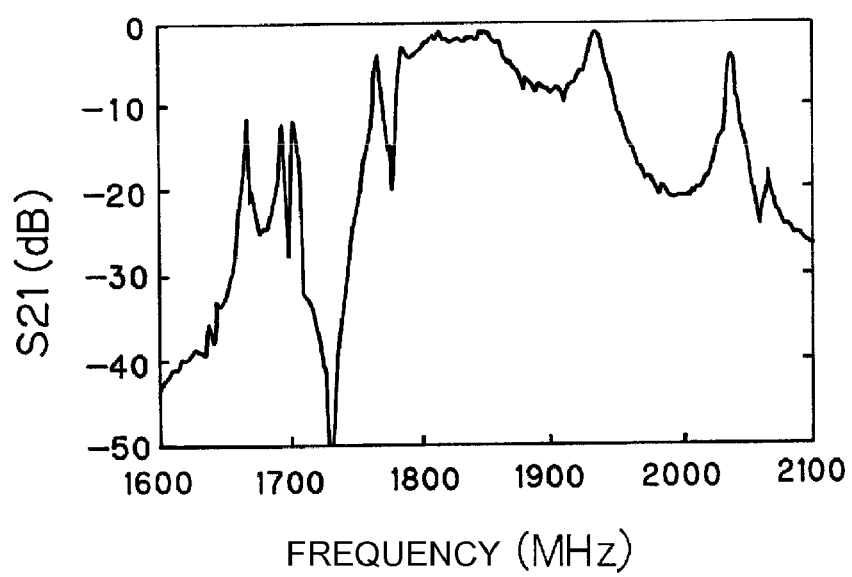
FIG. 10D is a graph showing a filter characteristic.

FIG. 10A to 10D show filter characteristics when the total number of pairs is 20 and only the thickness of the SiO2 insulating films 16 is changed. FIG. 10A shows a case where no SiO2 insulating film is provided, FIG. 10B shows a case where the thickness of the SiO2 insulating films 16 is about 0.3 μm, FIG. 10C shows a case where the thickness of the SiO2 insulating films 16 is about 0.34 μm, and FIG. 10D shows a case where the thickness of the SiO2 insulating films 16 is about 0.45 μm. The horizontal axis represents frequency (MHz), and the vertical axis represents a transfer factor S21 (dB). As is clear from FIGS. 10A to 10D, it is desirable to set the thickness of the SiO2 insulating films 16 to about 0.34 μm so as to achieve a wide-band characteristic with reduced ripples.

In the piezoelectric thin-film filter 10, since the insulating films 16 are provided in non-electrode portions between electrode pairs, coupling between the electrode pairs can be strengthened. Thus, a wide-band filter can be achieved. Since an electrode width (the width Wm of an electrode pair) and each of the widths (Wa and Wf) of non-electrode portions can be increased, a filter element can be formed without using high-accuracy fine processing technology. Thus, the cost of manufacturing can be reduced. Since the electrode width is large, a plurality of vibration modes can be used, thus achieving a wide-band filter. In addition, since the electrode width is large, a reduced parasitic resistance can be achieved.

Second Preferred Embodiment

A piezoelectric thin-film filter 60 according to a second preferred embodiment will be described with reference to FIG. 16. FIG. 16 is a main-portion sectional view of the piezoelectric thin-film filter 60.

As in the first preferred embodiment, on one main surface 66a of a piezoelectric thin film 66, first electrode fingers 61 of a first electrode pair and third electrode fingers 63 of a second electrode pair are disposed alternately with gaps therebetween, and insulating films 65 are provided between adjacent electrode fingers 61 and 63. On the other main surface 66b of the piezoelectric thin film 66, second electrode fingers 62 of the first electrode pair and fourth electrode fingers 64 of second electrode pair are disposed alternately with gaps therebetween so as to face the electrode fingers 61 and 63. The electrode fingers 61 and 62 of the first electrode pair are connected to unbalanced terminals, and the electrode fingers 63 and 64 of the second electrode pair are connected to balanced terminals.

Unlike the first preferred embodiment, in the second electrode pair, the width of each of the third electrode fingers 63 is different from the width of each of the fourth electrode fingers 64. Alternatively, the positions of the third electrode fingers 63 are shifted from the positions of the corresponding fourth electrode fingers 64.

For example, when the first electrode fingers 61 of the first electrode pair are grounded, the third electrode fingers 63 of the second electrode pair are closer to the ground potential compared with the fourth electrode fingers 64 of the second electrode pair. Thus, the balance between the electrode fingers 63 and 64 of the second electrode pair is degraded. When the width of each of the third electrode fingers 63, which are closer to the grounded first electrode fingers 61, is set to be relatively narrow and the width of each of the fourth electrode fingers 64, which are away from the grounded first electrode fingers 61, is set to be relatively wide so that the fourth electrode fingers 64 can be closer to the first electrode fingers 61, balance can be maintained.

Third Preferred Embodiment

A piezoelectric thin-film filter 70 according to a third preferred embodiment will be described with reference to FIG. 17. FIG. 17 is a main-portion sectional view of the piezoelectric thin-film filter 70.

As in the first preferred embodiment, on one main surface 76a of a piezoelectric thin film 76, first electrode fingers 71 of a first electrode pair and third electrode fingers 73 of a second electrode pair are disposed alternately with gaps therebetween, and insulating films 75 are provided between adjacent electrode fingers 71 and 73. On the other main surface 76b of the piezoelectric thin film 76, second electrode fingers 72 of the first electrode pair and fourth electrode fingers 74 of the second electrode pair are disposed alternately with gaps therebetween so as to face the electrode fingers 71 and 73.

The third preferred embodiment is different from the first preferred embodiment in that the width of each of the electrode fingers 71 and 72 of the first electrode pair is different from the width of each of the electrode fingers 73 and 74 of the second electrode pair. Thus, since an area facing the electrode fingers 71 and 72 of the first electrode pair is different from an area facing the electrode fingers 73 and 74 of the second electrode pair, the impedance of the first electrode pair is different from the impedance of the second electrode pair. Therefore, an impedance difference between an input terminal and an output terminal can be achieved. That is, impedance can be changed between input and output.

By setting the number of pairs of electrode fingers in electrode pairs to be different between an input terminal and an output terminal, impedance can be changed between input and output.

Fourth Preferred Embodiment

A composite filter 90 according to a fourth preferred embodiment will be described with reference to the schematic diagram of FIG. 18.

The composite filter 90 is formed by combining a piezoelectric thin-film filter 80 with a lattice filter 88. The piezoelectric thin-film filter 80 includes insulating films 85 provided between adjacent electrode fingers 81, 82, 83, and 84. The insulating films 85 may be provided only on one main surface of a piezoelectric thin film 86, as in the first to third preferred embodiments. Instead of the lattice filter 88, another type of filter, such as a ladder filter, may be combined.

By combining the piezoelectric thin-film filter 80 with a lattice filter, ladder filter, or the like, a filter with an excellent out-of-band attenuation characteristic can be achieved. The lattice filter 88 or the ladder filter can be formed at about the same time by substantially the same process.

Fifth Preferred Embodiment

A piezoelectric thin-film filter according to a fifth preferred embodiment will be described with reference to the plan view of FIG. 19.

The piezoelectric thin-film filter is formed substantially similarly to the piezoelectric thin-film filter according to the first preferred embodiment and includes a plurality of units 10x, which are filter elements. FIG. 19 shows only one unit 10x.

In the unit 10x of the piezoelectric thin-film filter according to the fifth preferred embodiment, on a portion of a piezoelectric thin film 14x that is separated from a substrate 12x with a gap 13x therebetween, the portion being part of the piezoelectric thin film 14x supported by the substrate 12x, a first electrode pair 20x and a second electrode pair 30x are formed.

On one main surface of the piezoelectric thin film 14x (a main surface opposite to the substrate 12x), ten first electrode fingers 26 of the first electrode pair 20x and ten third electrode fingers 36 of the second electrode pair are disposed alternately with gaps therebetween. A wire (busbar) 27 connecting the first electrode fingers 26 is connected to a port-1 terminal 17b. A wire (busbar) 37 connecting the third electrode fingers 36 is connected to a port-2 terminal 17e. Although not illustrated, as in the first preferred embodiment, insulating films are provided in the gaps. A second insulating film may be arranged so as to cover all the first electrode fingers 26, the third electrode fingers, and the insulating films provided between adjacent electrode fingers 26 and 36.

Unlike the first preferred embodiment, on the other main surface of the piezoelectric thin film 14x (a main surface on the substrate 12x side), a substantially rectangular common electrode 46 is provided. The common electrode 46 is connected to GND terminals 17a, 17c, 17d, and 17f. The common electrode 46 includes portions corresponding to second electrode fingers that face the first electrode fingers 26 of the first electrode pair and portions corresponding to fourth electrode fingers that face the third electrode fingers 36 of the second electrode pair. Portions in which the first electrode fingers 26 face the common electrode 46 and portions in which the third electrode fingers 36 face the common electrode 46 form resonators. A second insulating film covering the entire common electrode 46 may be provided.

The common electrode 46 covers an area larger than an area facing the first electrode fingers 26 and the third electrode fingers 36 (an area corresponding to the second electrode fingers and the fourth electrode fingers). Thus, even if the alignment of the common electrode 46 with respect to the electrode fingers 26 and 36 deviates, such deviation hardly affects the characteristics of the resonators. Thus, unlike the first preferred embodiment in which electrode fingers face each other with a piezoelectric thin film therebetween, high-accuracy alignment is not necessary. Therefore, a simplified process can be achieved.

A common electrode may be provided on the one main surface of the piezoelectric thin film (the main surface opposite to the substrate) and electrode fingers may be provided on the other main surface (the main surface on the substrate side). The common electrode is provided for at least one of a plurality of units of the piezoelectric thin-film filter.

Since insulating films are provided between adjacent first electrode fingers 26 and third electrode fingers 36, coupling between resonators formed between the first electrode fingers 26 and the common electrode 46 that face each other with the piezoelectric thin film 14x therebetween and resonators formed between the third electrode fingers 36 and the common electrode 46 that face each other with the piezoelectric thin film 14x therebetween can be strengthened. Thus, propagation of vibration between adjacent resonators can be easily performed. Accordingly, even if each of the center-to-center distances between the first electrode fingers 26 and the third electrode fingers 36 is larger than a value twice the thickness of the piezoelectric thin film 14x, an excellent filter characteristic can be achieved, as in the first preferred embodiment.

Figure 19:
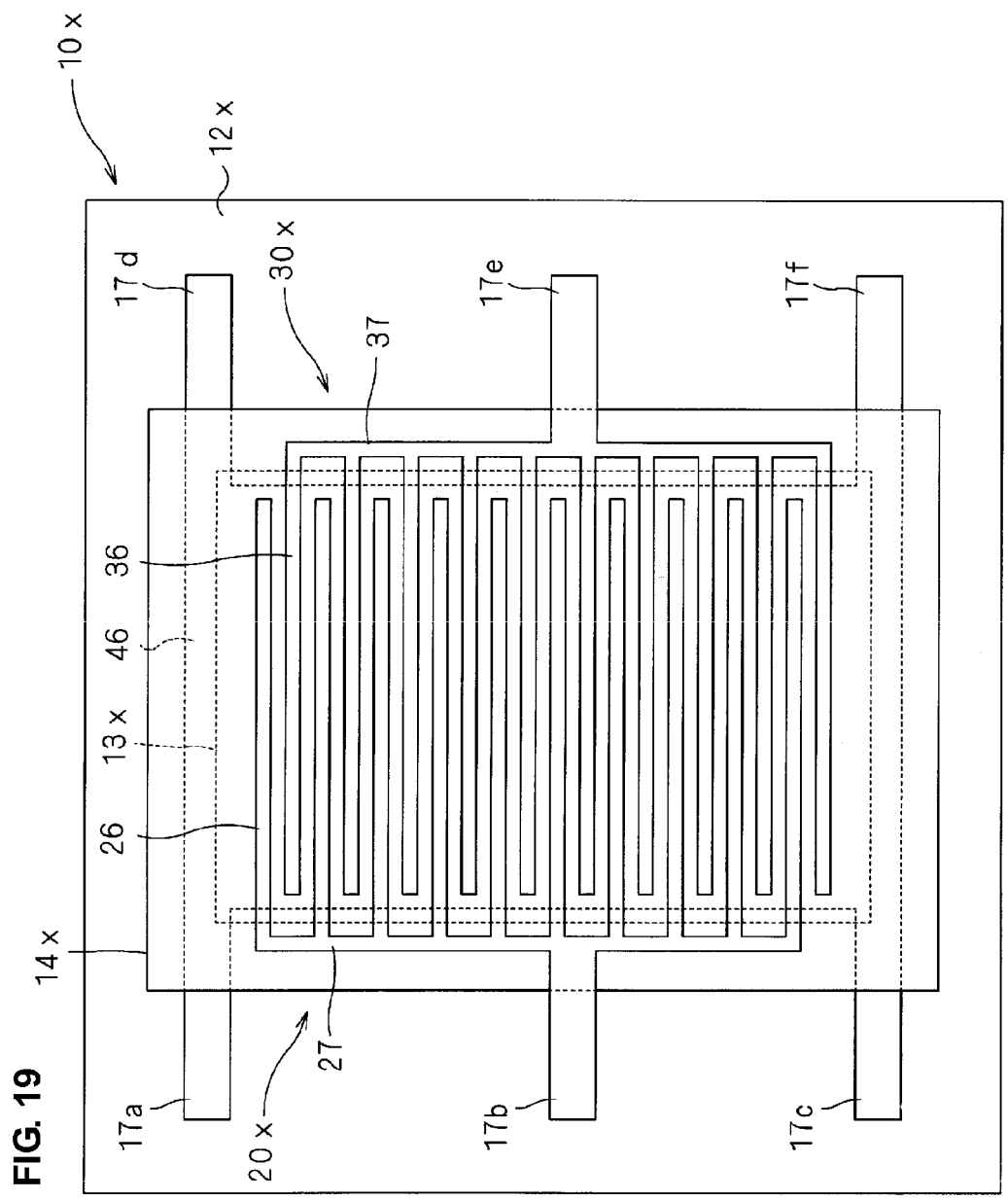
FIG. 19 is a plan view of a piezoelectric thin-film filter according to a preferred embodiment of the present invention.

In the example shown in FIG. 19, the outermost electrode fingers in the arrangement of the electrode fingers 26 and 36 are a first electrode finger 26 and a third electrode finger 36. However, for example, by increasing the number of the third electrode fingers 36 by one, the outermost electrode fingers may be third electrode fingers 36. In this case, ten first electrode fingers 24 and eleven third electrode fingers 36 are provided. Since the impedance on the side in which the number of electrode fingers is larger is lower, the impedance ratio of an input terminal to an output terminal can be set to any value by appropriately selecting the number of electrode fingers.

For example, when the number of electrode fingers on an input side is two and the number of electrode fingers on an output side is three, the impedance ratio of the input terminal to the output terminal is set to 3:2. In a case where two electrode fingers are provided on the input side and two sets of three electrode fingers, which constitutes a filter element as a unit, are provided on the output side, when parallel connection is used on the input side and series connection is used on the output side, the impedance ratio of the input terminal to the output terminal is set to 3:8.

Sixth Preferred Embodiment

Figure 20:
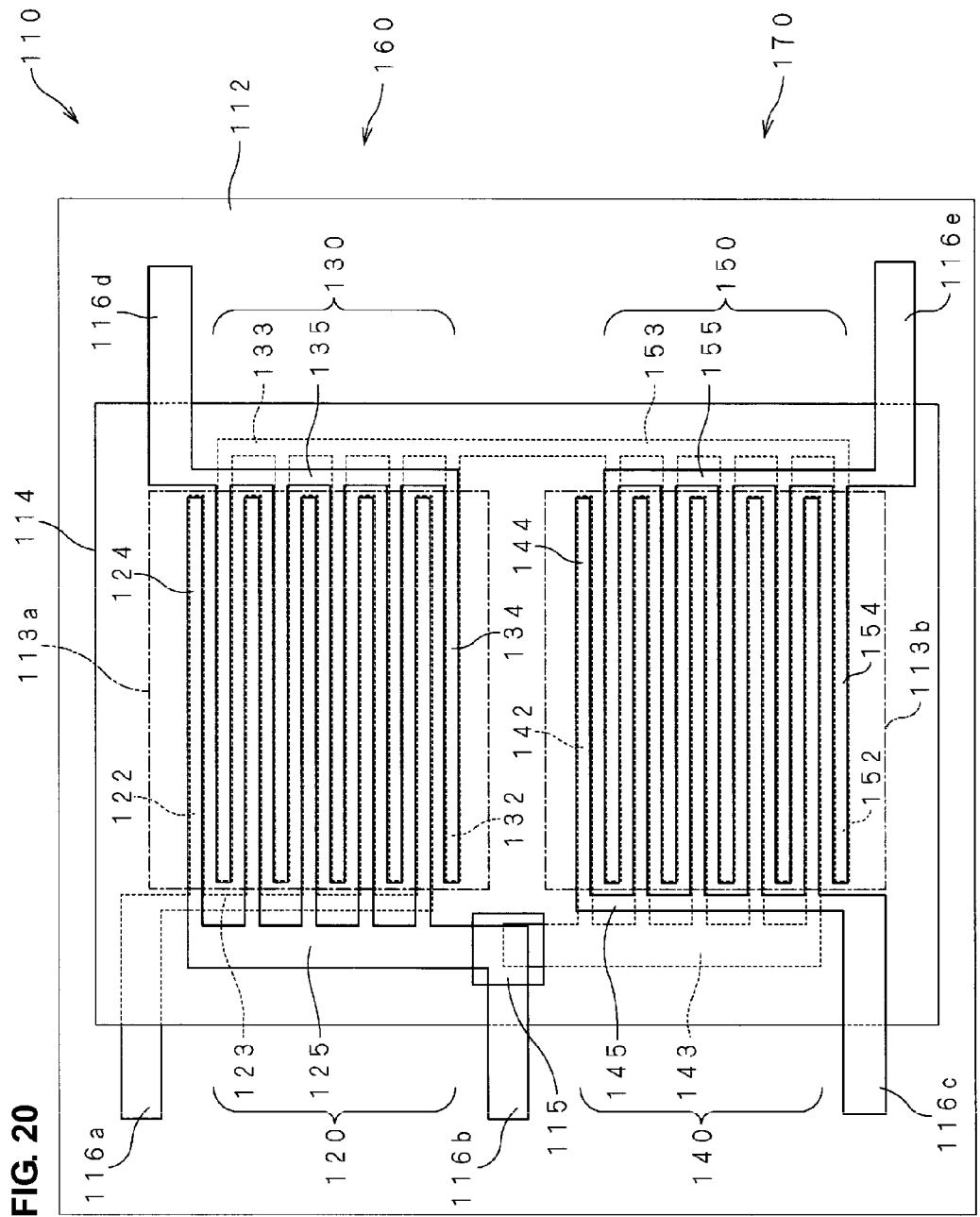
FIG. 20 is a plan view of a piezoelectric thin-film filter according to a preferred embodiment of the present invention.
Figure 21:
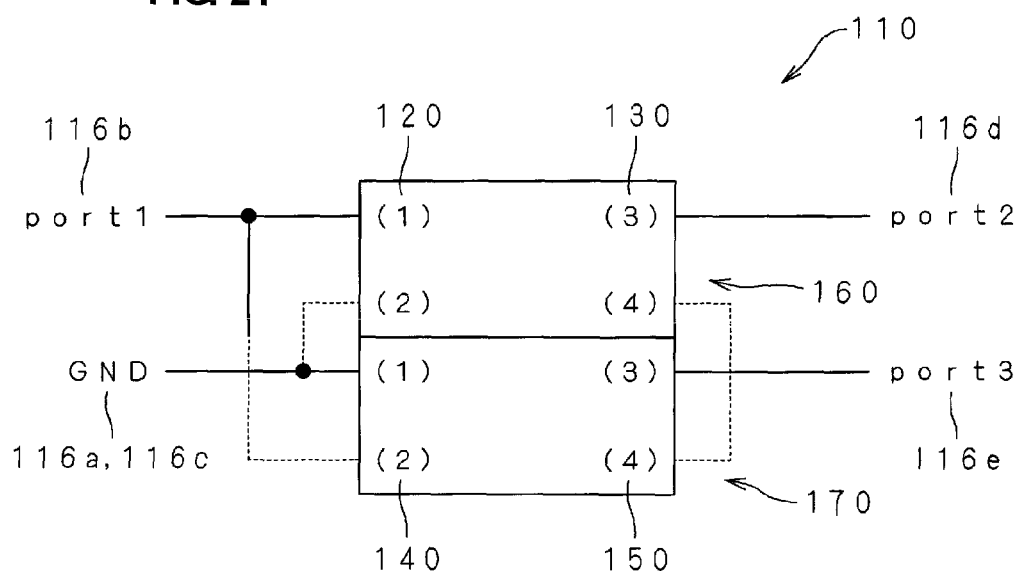
FIG. 21 is a block diagram of a piezoelectric thin-film filter according to a preferred embodiment of the present invention.

A piezoelectric thin-film filter 110 according to a sixth preferred embodiment will be described with reference to FIGS. 20 and 21. FIG. 20 is a plan view of the piezoelectric thin-film filter 110. FIG. 21 is a block diagram of the piezoelectric thin-film filter 110.

As shown in FIG. 20, the piezoelectric thin-film filter 110 is configured substantially similarly to the piezoelectric thin-film filter according to the first preferred embodiment.

On portions of a piezoelectric thin film 114 that are separated from a substrate 112 with gaps 113a and 113b therebetween, the portions being part of the piezoelectric thin film 114 supported by the substrate 112, a first unit 160 including a first electrode pair 120 and a second electrode pair 130 and a second unit 170 including a third electrode pair 140 and a fourth electrode pair 150 are formed adjacent to each other.

On one main surface of the portion of the piezoelectric thin film 114 that is separated from the substrate 112 with the gap 113a therebetween (the main surface opposite to the substrate 112), five first electrode fingers 124 of the first electrode pair 120 and five third electrode fingers 134 of the second electrode pair 130 are disposed alternately with gaps therebetween. On one main surface of the portion of the piezoelectric thin-film 114 that is separated from the substrate 112 with the gap 113b therebetween (the main surface opposite to the substrate 112), five first electrode fingers 144 of the third electrode pair 140 and five third electrode fingers 154 of the fourth electrode pair are disposed alternately with gaps therebetween. Insulating films may be provided in the gaps between the electrode fingers 124 and 134; and 144 and 154. In addition, a second insulating film covering all the first electrode fingers 124 and 144 and the third electrode fingers 134 and 154 and the insulating films provided between the electrode fingers 124 and 134; and 144 and 154 may be provided.

On the other main surface of the portion of the piezoelectric thin film 114 that is separated from the substrate 112 with the gap 113a therebetween (the main surface on the substrate 112 side), five second electrode fingers 122 facing the first electrode fingers 124 of the first electrode pair 120 and five fourth electrode fingers 132 facing the third electrode fingers 134 of the second electrode pair 130 are disposed alternately with gaps therebetween. On the other main surface of the portion of the piezoelectric thin film 114 that is separated from the substrate 112 with the gap 113b therebetween (the main surface on the substrate 112 side), five second electrode fingers 142 facing the first electrode fingers 144 of the third electrode pair 140 and five fourth electrode fingers 152 facing the third electrode fingers 154 of the fourth electrode pair 150 are disposed alternately with gaps therebetween.

Unlike the first preferred embodiment, a wire (busbar) 125 connecting the first electrode fingers 124 of the first electrode pair 120 is connected to an end portion of a wire (busbar) 143 connecting the second electrode fingers 142 of the third electrode pair 140 in a through-hole 115 formed in the piezoelectric thin film 114 and is connected to a port-1 terminal 116b. A wire (busbar) 123 connecting the second electrode fingers 122 of the first electrode pair 120 is connected to a GND terminal 116a. A wire (busbar) 145 connecting the first electrode fingers 144 of the third electrode pair 140 is connected to a GND terminal 116c. A wire (busbar) 135 connecting the third electrode fingers 134 of the second electrode pair 130 is connected to a port-2 terminal 116d. A wire (busbar) 155 connecting the third electrode fingers 154 of the fourth electrode pair 150 is connected to a port-3 terminal 116e. A wire (busbar) 133 connecting the fourth electrode fingers 132 of the second electrode pair 130 and a wire (busbar) 153 connecting the fourth electrode fingers 152 of the fourth electrode pair 150 are connected to each other. The wires 133 and 153 that are connected to each other are located at electrically neutral points between the terminals 116d and 116e. The wires 133 and 153 may be electrically floated or grounded.

As shown in FIG. 21, in the piezoelectric thin-film filter 110, the input terminals 116b; and 116a and 116c are connected in parallel to the first and second units 160 and 170 such that the first and second electrode fingers are replaced with each other, and the output terminals 116d and 116e are connected in series to the first and second units 160 and 170, respectively. In FIG. 21, (1) represents the first electrode fingers 124 and 144, (2) represents the second electrode fingers 122 and 142, (3) represents the third electrode fingers 134 and 154, and (4) represents the fourth electrode fingers 132 and 152. The solid lines represent wires on the main surface of the piezoelectric thin-film 14 opposite to the substrate 112, and the broken lines represent wires on the main surface of the piezoelectric thin-film 14 on the substrate 112 side. The input terminals 116b; and 116a and 116c are connected to unbalanced terminals, and the output terminals 116d and 116e are connected to balanced terminals. Input and output may be reversed.

With the configuration according to the sixth preferred embodiment, a balanced filter exhibiting an input impedance of about 50 Ω and an output impedance of about 200 Ω is achieved.

Seventh Preferred Embodiment

Figure 22:
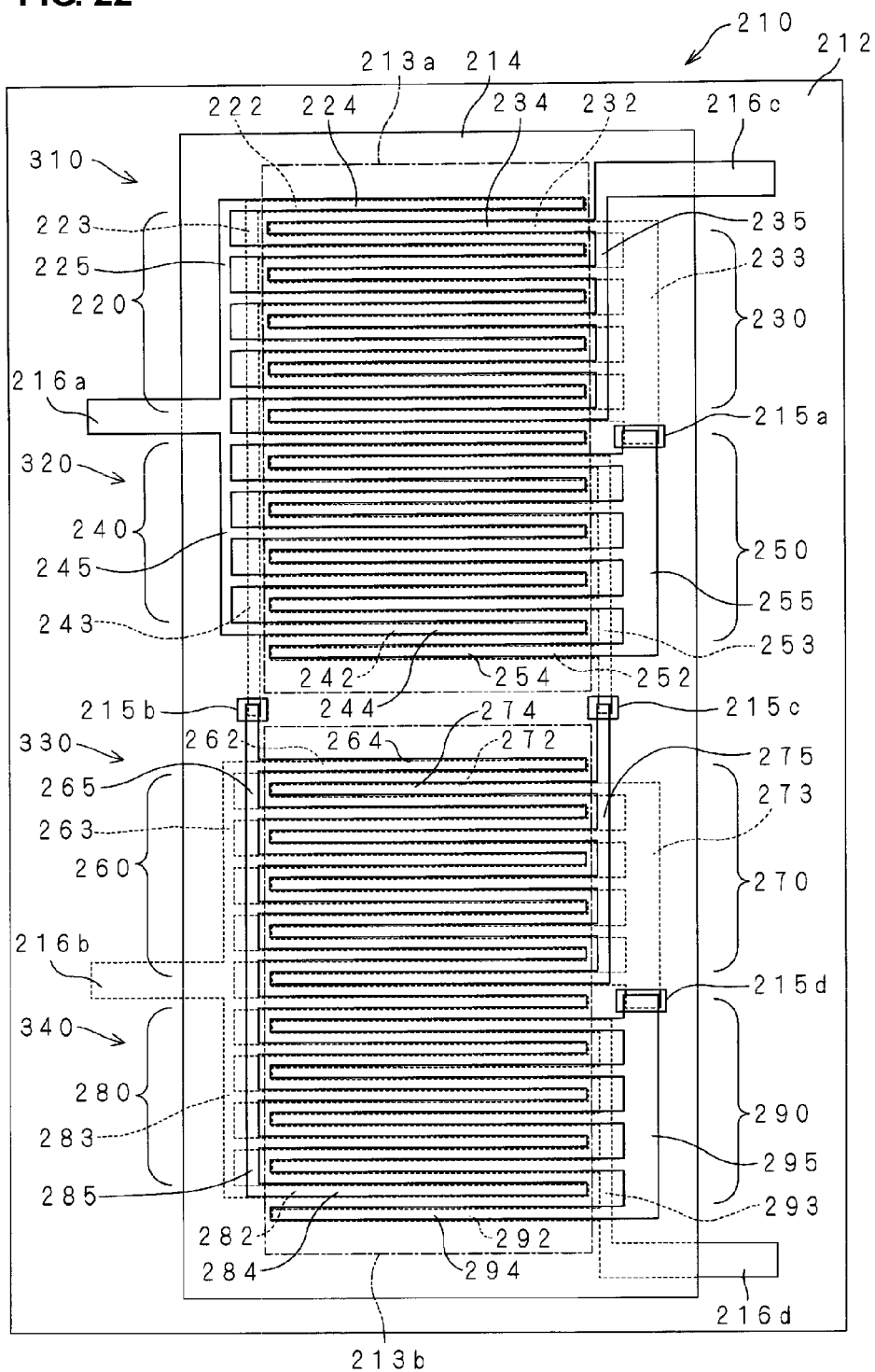
FIG. 22 is a plan view of a piezoelectric thin-film filter according to a preferred embodiment of the present invention.
Figure 23:
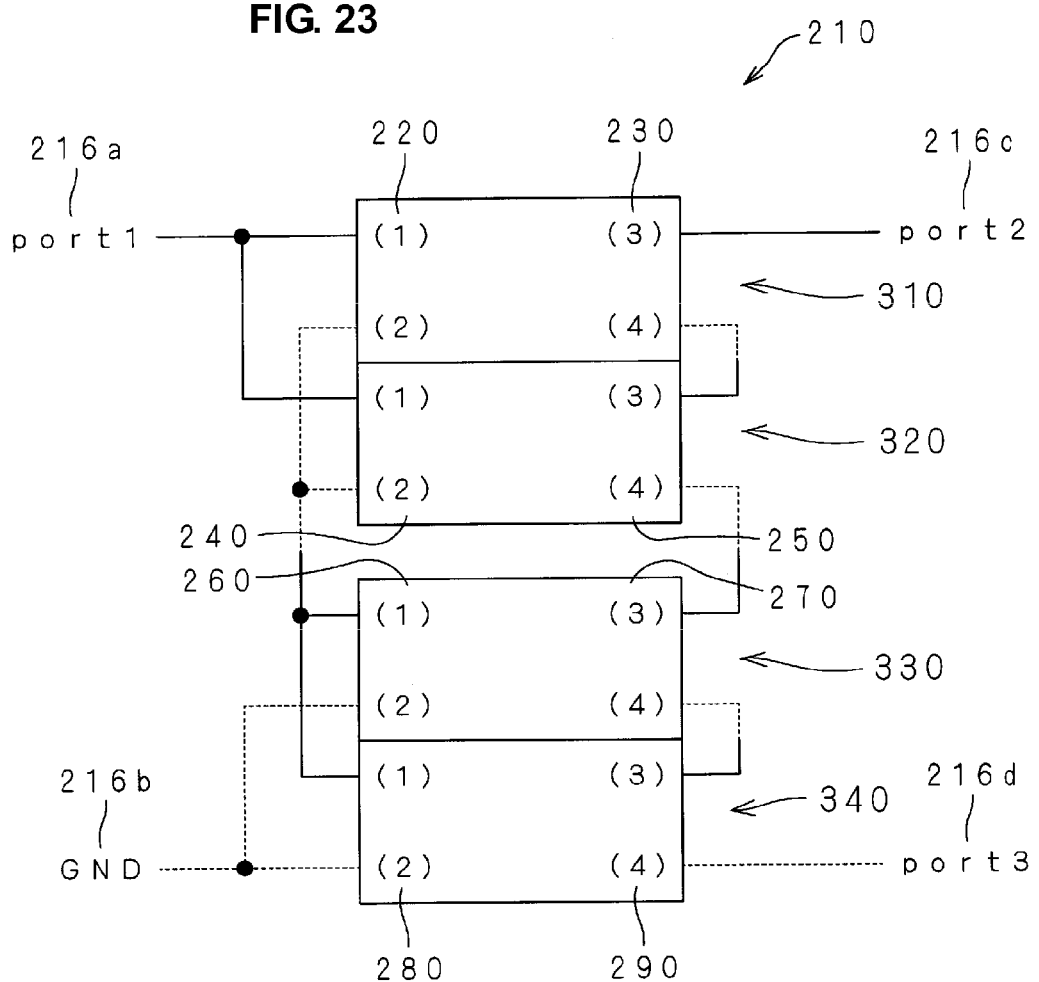
FIG. 23 is a block diagram of a piezoelectric thin-film filter according to a preferred embodiment of the present invention.

A piezoelectric thin-film filter 210 according to a seventh preferred embodiment will be described with reference to FIGS. 22 and 23. FIG. 22 is a plan view of the piezoelectric thin-film filter 210, and FIG. 23 is a block diagram of the piezoelectric thin-film filter 210.

As shown in FIG. 22, the piezoelectric thin-film filter 210 is configured substantially similarly to the piezoelectric thin-film filter according to the first preferred embodiment.

On portions of a piezoelectric thin film 214 that are separated from a substrate 212 with two gaps 213a and 213b therebetween, the portions being part of the piezoelectric thin film 214 supported by the substrate 212, a first unit 310 including a first electrode pair 220 and a second electrode pair 230, a second unit 320 including a third electrode pair 240 and a fourth electrode pair 250, a third unit 330 including a fifth electrode pair 260 and a sixth electrode pair 270, and a fourth unit 340 including a seventh electrode pair 280 and an eighth electrode pair 290 are formed adjacent to each other in that order.

The length of each of the electrode fingers included in the units 310, 320, 330, and 340 is twice the length of each of the electrode fingers included in the units 91 and 92 in the first embodiment. When the length of each of the electrode fingers included in the units 310, 320, 330, and 340 is twice the length of each of the electrode fingers included in the units 91 and 92 in the first embodiment, each of the units 310, 320, 330, and 340 exhibits an input impedance of 50 Ω and an output impedance of 50 Ω.

On one main surface of the piezoelectric thin film 214 that is separated from the substrate 212 with the gap 213a therebetween (the main surface opposite to the substrate 212), five first electrode fingers 224 of the first electrode pair 220 and five first electrode fingers 244 of the third electrode pair 240; and five third electrode fingers 234 of the second electrode pair 230 and five third electrode fingers 254 of the fourth electrode pair 250 are disposed alternately with gaps therebetween. On one main surface of the piezoelectric thin film 214 that is separated from the substrate 212 with the gap 213b therebetween (the main surface opposite to the substrate 212), five first electrode fingers 264 of the fifth electrode pair 260 and five first electrode fingers 284 of the seventh electrode pair 280; and five third electrode fingers 274 of the sixth electrode pair 270 and five third electrode fingers 294 of the eighth electrode pair 290 are disposed alternately with gaps therebetween. Insulating films may be provided in the gaps between the electrode fingers 224, 234, 244, and 254; and 264, 274, 284, and 294. In addition, a second insulating film covering the electrode fingers 224, 234, 244, and 254; and 264, 274, 284, and 294 and the insulating films may be provided.

On the other main surface of the piezoelectric thin film 214 that is separated from the substrate 212 with the gap 213a therebetween (the main surface on the substrate 212 side), five second electrode fingers 222 facing the first electrode fingers 224 of the first electrode pair 220 and five second electrode fingers 242 facing the first electrode fingers 244 of the third electrode pair 240; and five fourth electrode fingers 232 facing the third electrode fingers 234 of the second electrode pair 230 and five fourth electrode fingers 252 facing the third electrode fingers 254 of the fourth electrode pair 250 are disposed alternately with gaps therebetween. On the other main surface of the piezoelectric thin film 214 that is separated from the substrate 212 with the gap 213b therebetween (the main surface on the substrate 212 side), five second electrode fingers 262 facing the first electrode fingers 264 of the fifth electrode pair 260 and five second electrode fingers 282 facing the first electrode fingers 284 of the seventh electrode pair 280; and five fourth electrode fingers 272 facing the third electrode fingers 274 of the sixth electrode pair 270 and five fourth electrode fingers 292 facing the third electrode fingers 294 of the eighth electrode pair 290 are disposed alternately with gaps therebetween. The first unit 310 and the second unit 320 are formed adjacent to each other in the portion of the piezoelectric thin film 214 that is separated from the substrate 212 with the gap 213a therebetween, and the gap between electrode fingers 232 and 234 in the first unit 310 and adjacent electrode fingers 242 and 244 in the second unit 320 is substantially the same as the gap between adjacent electrode fingers 222 and 232; 224 and 234; 242 and 252; and 244 and 254 in the units 310 and 320. Thus, since the adjacent first and second units 310 and 320 are mechanically coupled together, the entire units 310 and 320 operate integrally, resulting in reducing ripples each having a short period.

Similarly, the third unit 330 and the fourth unit 340 are formed adjacent to each other in the portion of the piezoelectric thin film 214 that is separated from the substrate 212 with the gap 213b therebetween, and the gap between electrode fingers 272 and 274 in the third unit 330 and adjacent electrode fingers 282 and 284 in the fourth unit 340 is substantially the same as the gap between adjacent electrode fingers 262 and 272; 264 and 274; 282 and 292; and 284 and 294 in the units 330 and 340. Thus, since the adjacent third and fourth units 330 and 340 are mechanically coupled together, the entire units 330 and 340 operate integrally, resulting in reducing ripples each having a short period.

Unlike the first preferred embodiment, a wire (busbar) 225 that is connected to the first electrode fingers 224 of the first electrode pair 220 is connected to a port-1 terminal 216a. A wire (busbar) 263 that is connected to the second electrode fingers 262 of the fifth electrode pair 260 is connected to a GND terminal 216b. A wire (busbar) 223 connecting the second electrode fingers 222 of the first electrode pair 220 is connected to a wire (busbar) 243 connecting the second electrode fingers 242 of the third electrode pair 240. A wire (busbar) 265 connecting the first electrode fingers 264 of the fifth electrode pair 260 is connected to a wire (busbar) 285 connecting the first electrode fingers 284 of the seventh electrode pair 280. In a through-hole 215b formed in the piezoelectric thin film 214, an end portion of the wire 243 of the third electrode pair 240 is connected to an end portion of a wire 275 of the fifth electrode pair 260.

A wire (busbar) 235 that is connected to the third electrode fingers 234 of the second electrode pair 230 is connected to a port-2 terminal 216c. A wire (busbar) 293 that is connected to the fourth electrode fingers 292 of the eighth electrode pair 290 is connected to a port-3 terminal 216d. In a through-hole 215a formed in the piezoelectric thin film 214, an end portion of a wire (busbar) 233 that is connected to the fourth electrode fingers 232 of the second electrode pair 230 is connected to an end portion of a wire (busbar) 255 of the third electrode fingers 254 of the fourth electrode pair 250. In a through-hoe 215c formed in the piezoelectric thin film 214, an end portion of a wire (busbar) 253 of the fourth electrode fingers 252 of the fourth electrode pair 250 is connected to an end portion of a wire (busbar) 275 that is connected to the third electrode fingers 274 of the sixth electrode pair 270. In a through-hole 215d formed in the piezoelectric thin film 214, an end portion of a wire (busbar) 273 of the fourth electrode fingers 272 of the sixth electrode pair 270 is connected to an end portion of a wire (busbar) 295 that is connected to the third electrode fingers 294 of the eighth electrode pair 290.

As shown in FIG. 23, in the piezoelectric thin-film filter 210, the input terminals 216a and 216b are connected in parallel to the units 310 and 320 and the units 330 and 340, and the output terminals 216c and 216d are connected in series to the units 310, 320, 330, and 340. In FIG. 23, (1) represents the first electrode fingers 224, 244, 264, and 284, (2) represents the second electrode fingers 222, 242, 262, and 282, (3) represents the third electrode fingers 234, 254, 274, and 294, and (4) represents the fourth electrode fingers 232, 252, 272, and 292. The solid lines represent wires on the main surface of the piezoelectric thin film 214 that is opposite to the substrate 212, and the broken lines represent wires on the main surface of the piezoelectric thin film 214 on the substrate 212 side. The input terminals 216a and 216b are connected to unbalanced terminals, and the output terminals 216c and 216d are connected to balanced terminals. Input and output can be reversed.

With the configuration according to the seventh preferred embodiment, a balanced filter exhibiting an input impedance of about 50 Ω and an output impedance of about 200 Ω can be achieved.

When a unit exhibiting an impedance of about 50 Ω is used, the influence of stray capacitance can be reduced compared with a case where a unit exhibiting an impedance of about 100 Ω is used.

Each of the above-described piezoelectric thin-film filters is capable of adjusting the impedance ratio of an input terminal to an output terminal.

A piezoelectric thin-film filter according to the present invention is not necessarily limited to any of the above-described preferred embodiments. Various modifications can be made to the present invention.

For example, first electrode fingers, third electrode fingers, and insulating films may be provided on the main surface of the piezoelectric thin film on the substrate side. The piezoelectric thin film may be supported by at least two film-like supportive units such that part of the piezoelectric thin film is separated from the substrate with a gap layer therebetween.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A piezoelectric thin-film filter comprising:
 a substrate;
 a piezoelectric thin film supported by the substrate and including a portion that is acoustically separated from the substrate;
 a first electrode pair including at least two first electrode fingers disposed on one main surface of the portion of the piezoelectric thin film that is acoustically separated from the substrate and at least two second electrode fingers disposed on the other main surface of the portion of the piezoelectric thin film that is acoustically separated from the substrate so as to face the first electrode fingers with the piezoelectric thin film therebetween; and
 a second electrode pair including at least two third electrode fingers disposed on the one main surface of the portion of the piezoelectric thin film that is acoustically separated from the substrate such that the first electrode fingers and the third electrode fingers are disposed alternately with gaps therebetween and fourth electrode fingers disposed on the other main surface of the portion of the piezoelectric thin film that is acoustically separated from the substrate so as to face the third electrode fingers with the piezoelectric thin film therebetween; wherein a filter element defined by the first electrode pair and the second electrode pair is provided between a set including a first terminal connected to each of the first electrode fingers and a second terminal connected to each of the second electrode fingers and a set including a third terminal connected to each of the third electrode fingers and a fourth terminal connected to each of the fourth electrode fingers;

the piezoelectric thin-film filter include insulating films provided between the first electrode fingers and the third electrode fingers that are disposed alternately with the gaps therebetween on the one main surface of the piezoelectric thin film;

each of center-to-center distances between the first electrode fingers and the third electrode fingers that are disposed alternately with the gaps therebetween is larger than a value twice the thickness of the portion of the piezoelectric thin film that is acoustically separated from the substrate; and further comprising a second insulating film provided in at least one of a first area covering the first electrode fingers, the third electrode fingers, and the insulating films; a second area covering the second electrode fingers and the fourth electrode fingers.

2. A piezoelectric thin-film filter comprising:

a substrate;

a piezoelectric thin film supported by the substrate and including a portion that is acoustically separated from the substrate;

at least two first electrode fingers disposed on one main surface of the portion of the piezoelectric thin film that is acoustically separated from the substrate and at least two third electrode fingers disposed on the one main surface of the portion of the piezoelectric thin film that is acoustically separated from the substrate such that the first electrode fingers and the third electrode fingers are disposed alternately with gaps therebetween; and a common electrode disposed on the other main surface of the portion of the piezoelectric thin film that is acoustically separated from the substrate and including portions facing the first electrode fingers and the third electrode fingers with the piezoelectric thin film therebetween; wherein a first electrode pair is defined by the first electrode fingers and the common electrode;

a second electrode pair is defined by the third electrode fingers and the common electrode;

a filter element defined by the first electrode pair and the second electrode pair is provided between a set including a first terminal connected to each of the first electrode fingers and a second terminal connected to the common electrode and a set including a third terminal connected to each of the third electrode fingers and a fourth terminal connected to the common electrode;

insulating films provided between the first electrode fingers and the third electrode fingers are disposed alternately with the gaps therebetween on the one main surface of the piezoelectric thin film;

each of the center-to-center distances between the first electrode fingers and the third electrode fingers that are disposed alternately with the gaps therebetween is larger than a value twice the thickness of the piezoelectric thin film;

the filter element is a unit;

at least two units connected in series to one of input terminals and output terminals are provided; and at least two of the at least two units are connected in parallel to the other one of the output terminals and the input terminals.

3. A piezoelectric thin-film filter comprising:

at least two filter elements; each of the at least two filter elements comprises:

a substrate;

a piezoelectric thin film supported by the substrate and including a portion that is acoustically separated from the substrate;

a first electrode pair including at least two first electrode fingers disposed on one main surface of the portion of the piezoelectric thin film that is acoustically separated from the substrate and at least two second electrode fingers disposed on the other main surface of the portion of the piezoelectric thin film that is acoustically separated from the substrate so as to face the first electrode fingers with the piezoelectric thin film therebetween; and a second electrode pair including at least two third electrode fingers disposed on the one main surface of the portion of the piezoelectric thin film that is acoustically separated from the substrate such that the first electrode fingers and the third electrode fingers are disposed alternately with gaps therebetween and fourth electrode fingers disposed on the other main surface of the portion of the piezoelectric thin film that is acoustically separated from the substrate so as to face the third electrode fingers with the piezoelectric thin film therebetween; wherein the first electrode pair and the second electrode pair is provided between a set including a first terminal connected to each of the first electrode fingers and a second terminal connected to each of the second electrode fingers and a set including a third terminal connected to each of the third electrode fingers and a fourth terminal connected to each of the fourth electrode fingers;

the piezoelectric thin-film filter includes insulating films provided between the first electrode fingers and the third electrode fingers that are disposed alternately with the gaps therebetween on the one main surface of the piezoelectric thin film; and each of center-to-center distances between the first electrode fingers and the third electrode fingers that are disposed alternately with the gaps therebetween is larger than a value twice the thickness of the portion of the piezoelectric thin film that is acoustically separated from the substrate;

the first terminal and the second terminal of each of the filter elements are connected in parallel to one of input terminals and output terminals, and the third terminal and the fourth terminal of each of the filter elements are connected in series between the other one of the input terminals and the output terminals.

4. The piezoelectric thin-film filter according to claim 3, wherein, for each of the at least two filter elements, the width of all of the electrode fingers is larger than the value twice the thickness of the portion of the piezoelectric thin film that is acoustically separated from the substrate.

5. The piezoelectric thin-film filter according to claim 3, wherein, for each of the at least two filter elements, the first terminal and the second terminal are connected to unbalanced terminals, and the third terminal and the fourth terminal are connected to balanced terminals.

6. The piezoelectric thin-film filter according to claim 3, wherein, for each of the at least two filter elements, the piezoelectric thin film is acoustically separated from the substrate with a gap layer or an opening therebetween.

7. The piezoelectric thin-film filter according to claim 3, wherein, for each of the at least two filter elements, the one main surface of the piezoelectric thin film includes, outside a resonant area in which the first electrode fingers, the third electrode fingers, and the insulating films are disposed, a non-resonant area that continuously extends from the resonant area.

8. A composite filter comprising:
at least one of a ladder filter or a lattice filter that is cascade connected to the piezoelectric thin-film filter according to claim 3.

9. The piezoelectric thin-film filter according to claim 3, wherein, for each of the at least two filter elements, the first electrode fingers, the third electrode fingers, and the insulating films are formed using a common resist pattern on the one main surface of the piezoelectric thin film.

10. The piezoelectric thin-film filter according to claim 3, wherein, for each of the at least two filter elements, the piezoelectric thin film is an epitaxial film.

11. The piezoelectric thin-film filter according to claim 3, wherein, for each of the at least two filter elements, the total sum of the number of pairs of first electrode fingers and second electrode fingers included in the first electrode pair and the number of pairs of third electrode fingers and fourth electrode fingers included in the second electrode pair is at least twenty.

12. A piezoelectric thin-film filter comprising:
a substrate;
a piezoelectric thin film supported by the substrate and including a portion that is acoustically separated from the substrate;
a first electrode pair including at least two first electrode fingers disposed on one main surface of the portion of the piezoelectric thin film that is acoustically separated from the substrate and at least two second electrode fingers disposed on the other main surface of the portion of the piezoelectric thin film that is acoustically separated from the substrate so as to face the first electrode fingers with the piezoelectric thin film therebetween; and
a second electrode pair including at least two third electrode fingers disposed on the one main surface of the portion of the piezoelectric thin film that is acoustically separated from the substrate such that the first electrode fingers and the third electrode fingers are disposed alternately with gaps therebetween and fourth electrode fingers disposed on the other main surface of the portion of the piezoelectric thin film that is acoustically separated from the substrate so as to face the third electrode fingers with the piezoelectric thin film therebetween; wherein
a filter element defined by the first electrode pair and the second electrode pair is provided between a set including a first terminal connected to each of the first electrode fingers and a second terminal connected to each of the second electrode fingers and a set including a third terminal connected to each of the third electrode fingers and a fourth terminal connected to each of the fourth electrode fingers;
the piezoelectric thin-film filter include insulating films provided between the first electrode fingers and the third electrode fingers that are disposed alternately with the gaps therebetween on the one main surface of the piezoelectric thin film;
each of center-to-center distances between the first electrode fingers and the third electrode fingers that are disposed alternately with the gaps therebetween is larger than a value twice the thickness of the portion of the piezoelectric thin film that is acoustically separated from the substrate; and
the number of pairs of first electrode fingers and second electrode fingers included in the first electrode pair is different from the number of pairs of third electrode fingers and fourth electrode fingers included in the second electrode pair.

13. A piezoelectric thin-film filter comprising:
a substrate;
a piezoelectric thin film supported by the substrate and including a portion that is acoustically separated from the substrate;
at least two first electrode fingers disposed on one main surface of the portion of the piezoelectric thin film that is acoustically separated from the substrate and at least two third electrode fingers disposed on the one main surface of the portion of the piezoelectric thin film that is acoustically separated from the substrate such that the first electrode fingers and the third electrode fingers are disposed alternately with gaps therebetween; and
a common electrode disposed on the other main surface of the portion of the piezoelectric thin film that is acoustically separated from the substrate and including portions facing the first electrode fingers and the third electrode fingers with the piezoelectric thin film therebetween; wherein
a first electrode pair is defined by the first electrode fingers and the common electrode;
a second electrode pair is defined by the third electrode fingers and the common electrode;
a filter element defined by the first electrode pair and the second electrode pair is provided between a set including a first terminal connected to each of the first electrode fingers and a second terminal connected to the common electrode and a set including a third terminal connected to each of the third electrode fingers and a fourth terminal connected to the common electrode;
insulating films provided between the first electrode fingers and the third electrode fingers are disposed alternately with the gaps therebetween on the one main surface of the piezoelectric thin film;
each of the center-to-center distances between the first electrode fingers and the third electrode fingers that are disposed alternately with the gaps therebetween is larger than a value twice the thickness of the piezoelectric thin film; and
the number of pairs of first electrode fingers and the common electrode included in the first electrode pair is different from the number of pairs of third electrode fingers and the common electrode included in the second electrode pair.

14. A piezoelectric thin-film filter comprising:
a substrate;
a piezoelectric thin film supported by the substrate and including a portion that is acoustically separated from the substrate;
a first electrode pair including at least two first electrode fingers disposed on one main surface of the portion of the piezoelectric thin film that is acoustically separated from the substrate and at least two second electrode fingers disposed on the other main surface of the portion of the piezoelectric thin film that is acoustically separated from the substrate so as to face the first electrode fingers with the piezoelectric thin film therebetween; and a second electrode pair including at least two third electrode fingers disposed on the one main surface of the portion of the piezoelectric thin film that is acoustically separated from the substrate such that the first electrode fingers and the third electrode fingers are disposed alternately with gaps therebetween and fourth electrode fingers disposed on the other main surface of the portion of the piezoelectric thin film that is acoustically separated from the substrate so as to face the third electrode fingers with the piezoelectric thin film therebetween; wherein a filter element defined by the first electrode pair and the second electrode pair is provided between a set including a first terminal connected to each of the first electrode fingers and a second terminal connected to each of the second electrode fingers and a set including a third terminal connected to each of the third electrode fingers and a fourth terminal connected to each of the fourth electrode fingers;

the piezoelectric thin-film filter include insulating films provided between the first electrode fingers and the third electrode fingers that are disposed alternately with the gaps therebetween on the one main surface of the piezoelectric thin film;

each of center-to-center distances between the first electrode fingers and the third electrode fingers that are disposed alternately with the gaps therebetween is larger than a value twice the thickness of the portion of the piezoelectric thin film that is acoustically separated from the substrate;

the filter element is a unit;

at least two units connected in series to one of input terminals and output terminals are provided; and at least two of the at least two units are connected in parallel to the other one of the output terminals and the input terminals.

15. The piezoelectric thin-film filter according to claim 14, wherein the at least two units are disposed adjacent to each other, and the adjacent units are mechanically coupled together.

16. The piezoelectric thin-film filter according to claim 14, wherein:
the input terminals are connected to unbalanced terminals; and
the output terminals are connected to balanced terminals.

17. The piezoelectric thin-film filter according to claim 14, wherein, for each of the at least two units, the piezoelectric thin film is acoustically separated from the substrate with a gap or an opening therebetween.

18. The piezoelectric thin-film filter according to claim 14, wherein
the at least two units comprise first and second units;
the first terminal of each of the units is connected to one of the input terminals;
the second terminal of each of the units is connected to the other one of the input terminals;
the fourth terminal of the first unit is connected to the third terminal of the second unit;
the third terminal of the first unit is connected to one of the output terminals;
the fourth terminal of the second unit is connected to the other one of the output terminals; and
the output terminals are connected to balanced terminals.

19. The piezoelectric thin-film filter according to claim 14, wherein:
first and second units are provided;
the first terminal of the first unit and the second terminal of the second unit are connected to one of the input terminals;
the second terminal of the first unit and the first terminal of the second unit are connected to the other one of the input terminals;
the fourth terminals of the units are connected to each other;
the third terminal of the first unit and the third terminal of the second unit are connected to the output terminals; and
the output terminals are connected to balanced terminals.

20. The piezoelectric thin-film filter according to claim 14, wherein:
the at least two units comprise first, second, third, and fourth units are provided;
the first terminal of the first unit and the first terminal of the second unit are connected to one of the input terminals;
the second terminal of the first unit, the second terminal of the second unit, the first terminal of the third unit, and the first terminal of the fourth unit are connected to each other;
the second terminal of the third unit and the second terminal of the fourth unit are connected to the other one of the input terminals;
the third terminal of the first unit is connected to one of the output terminals;
the fourth terminal of the first unit is connected to the third terminal of the second unit;
the fourth terminal of the second unit is connected to the third terminal of the third unit;
the fourth terminal of the third unit is connected to the third terminal of the fourth unit;
the fourth terminal of the fourth unit is connected to the other one of the output terminals; and
the output terminals are connected to balanced terminals.

21. The piezoelectric thin-film filter according to claim 14, wherein, for each of the at least two units
at least one common electrode is disposed on the portion of the one main surface or the other main surface of the piezoelectric thin film that is acoustically separated from the substrate; and
the first electrode fingers and the third electrode fingers or the second electrode fingers and the fourth electrode fingers of at least one unit is part of the same common electrode.

22. The piezoelectric thin-film filter according to claim 14, wherein, for each of the at least two units, additional insulating films are provided between adjacent electrode fingers in the portion of at least one of the main surfaces of the piezoelectric thin film that is acoustically separated from the substrate.

23. A piezoelectric thin-film filter comprising:
at least two filter elements; each of the at least two filter elements comprises:
a substrate;
a piezoelectric thin film supported by the substrate and including a portion that is acoustically separated from the substrate;
at least two first electrode fingers disposed on one main surface of the portion of the piezoelectric thin film that is acoustically separated from the substrate and at least two third electrode fingers disposed on the one main surface of the portion of the piezoelectric thin film that is acoustically separated from the substrate such that the first electrode fingers and the third electrode fingers are disposed alternately with gaps therebetween; and a common electrode disposed on the other main surface of the portion of the piezoelectric thin film that is acoustically separated from the substrate and including portions facing the first electrode fingers and the third electrode fingers with the piezoelectric thin film therebetween; wherein a first electrode pair is defined by the first electrode fingers and the common electrode;

a second electrode pair is defined by the third electrode fingers and the common electrode;

the first electrode pair and the second electrode pair is provided between a set including a first terminal connected to each of the first electrode fingers and a second terminal connected to the common electrode and a set including a third terminal connected to each of the third electrode fingers and a fourth terminal connected to the common electrode;

insulating films provided between the first electrode fingers and the third electrode fingers are disposed alternately with the gaps therebetween on the one main surface of the piezoelectric thin film; and each of the center-to-center distances between the first electrode fingers and the third electrode fingers that are disposed alternately with the gaps therebetween is larger than a value twice the thickness of the piezoelectric thin film;

the first terminal and the second terminal of each of the filter elements are connected in parallel to one of input terminals and output terminals, and the third terminal and the fourth terminal of each of the filter elements are connected in series between the other one of the input terminals and the output terminals.

24. A piezoelectric thin-film filter comprising:

a substrate;

a piezoelectric thin film supported by the substrate and including a portion that is acoustically separated from the substrate;

at least two first electrode fingers disposed on one main surface of the portion of the piezoelectric thin film that is acoustically separated from the substrate and at least two third electrode fingers disposed on the one main surface of the portion of the piezoelectric thin film that is acoustically separated from the substrate such that the first electrode fingers and the third electrode fingers are disposed alternately with gaps therebetween; and a common electrode disposed on the other main surface of the portion of the piezoelectric thin film that is acoustically separated from the substrate and including portions facing the first electrode fingers and the third electrode fingers with the piezoelectric thin film therebetween; wherein a first electrode pair is defined by the first electrode fingers and the common electrode;

a second electrode pair is defined by the third electrode fingers and the common electrode;

a filter element defined by the first electrode pair and the second electrode pair is provided between a set including a first terminal connected to each of the first electrode fingers and a second terminal connected to the common electrode and a set including a third terminal connected to each of the third electrode fingers and a fourth terminal connected to the common electrode;

insulating films provided between the first electrode fingers and the third electrode fingers are disposed alternately with the gaps therebetween on the one main surface of the piezoelectric thin film;

each of the center-to-center distances between the first electrode fingers and the third electrode fingers that are disposed alternately with the gaps therebetween is larger than a value twice the thickness of the piezoelectric thin film; and further comprising a second insulating film provided in at least one of a first area covering the first electrode fingers, the third electrode fingers, and the insulating films, and a second area covering the common electrode.

* * * * *